(12) United States Patent
Urabe et al.

(10) Patent No.: US 6,566,981 B2
(45) Date of Patent: May 20, 2003

(54) SURFACE ACOUSTIC WAVE DEVICE HAVING PLURAL GROUND CONDUCTOR FILMS IN THE HOUSING CAVITY

(75) Inventors: Masashi Urabe, Anjyo (JP); Kenji Noguchi, Sagamihara (JP); Kouichi Maruta, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/917,594

(22) Filed: Jul. 27, 2001

(65) Prior Publication Data

US 2002/0014121 A1 Feb. 7, 2002

(30) Foreign Application Priority Data

| Jul. 28, 2000 | (JP) | ................................. | 2000-229400 |
| Aug. 29, 2000 | (JP) | ................................. | 2000-259672 |
| Aug. 29, 2000 | (JP) | ................................. | 2000-259673 |
| Aug. 29, 2000 | (JP) | ................................. | 2000-259674 |
| Aug. 31, 2000 | (JP) | ................................. | 2000-264524 |
| Aug. 31, 2000 | (JP) | ................................. | 2000-264525 |

(51) Int. Cl.⁷ .............................................. H03H 9/64
(52) U.S. Cl. ...................... 333/193; 333/195; 333/133; 310/313 B
(58) Field of Search ................................. 333/193–196, 333/133; 310/313 R, 313 B, 313 C, 313 D

(56) References Cited

U.S. PATENT DOCUMENTS 4,365,219 A * 12/1982 Nathan ........................ 333/193
5,237,235 A * 8/1993 Cho et al. ................ 310/313 R
6,037,698 A * 3/2000 Ueda et al. ............. 310/313 R
6,388,545 B1 * 5/2002 Akikuni et al. ............. 333/193

FOREIGN PATENT DOCUMENTS

| JP | 10-209800 | | 8/1998 |
| JP | 10-224175 | | 8/1998 |
| JP | 11-205077 | | 7/1999 |
| JP | 2000-49565 | * | 2/2000 |
| JP | 2001-203555 | * | 7/2001 |

* cited by examiner

Primary Examiner—Barbara Summons
(74) Attorney, Agent, or Firm—Hogan & Hartson, LLP

(57) ABSTRACT

A surface acoustic wave device has: input external terminals, output external terminals and ground external terminals disposed on the outer peripheral surfaces of a container. In a cavity portion of the container, input pads, output pads and ground pads are respectively electrically connected to the input external terminals, the output external terminals and the ground external terminals. A plurality of SAW filter elements are housed in the cavity portion. A plurality of ground conductor films are respectively formed in areas where the SAW filter elements are respectively housed. The input, output and ground electrodes of the SAW filter elements are respectively connected to the input, the output and the ground pads. A metallic lid hermetically seals the cavity portion. Only one SAW filter element is connected to the same ground pad. All the round conductor films on which the SAW Liter elements are mounted are electrically separated from one another.

10 Claims, 15 Drawing Sheets

SURFACE ACOUSTIC WAVE DEVICE HAVING PLURAL GROUND CONDUCTOR FILMS IN THE HOUSING CAVITY

This application is based on application Nos. 2000-229400, 2000-259672, 2000-259673, 2000-259674, 2000-264524, and 2000-264525 filed in Japan, the contents of which are incorporated hereinto by reference.

BACKGROUND OF THE INVENTION

1. Field of the Invention

The present invention relates to a surface acoustic wave device such as a duplexer, a weak signal extracting filter or the like, and more particularly to a surface acoustic wave device in which a plurality of SAW filter elements are housed in a single container.

2. Description of Related Art

Recently, a surface acoustic wave filter formed by surface acoustic wave elements (hereinafter referred to as SAW filter), is used in a variety of communication fields. Because of its characteristics of high-performance, compact design, mass-productivity and the like, this SAW filter plays an important role of the diffusion of small-size communication devices such as cellular phones or the like.

The requirements for miniaturization and higher performance of small-size communication devices are increasing constantly in severity. Recently commercialized is a product in which a single container houses a plurality of SAW filters (e.g., a front-end SAW filter and an inter-stage SAW filter).

Examples of the product in which a single container houses a plurality of SAW filters, include a duplexer in which a signal in the reception frequency band is separated from a signal in the transmission frequency band, and a dual-or triple-band weak signal extracting filter in which signals in a plurality of frequency bands are separated from one another.

For example, a duplexer has, in a single container, a SAW filter element serving as a reception filter, and a SAW filter element serving as a transmission filter. A weak signal extracting filter comprises a front-end SAW filter element, an amplifying circuit and an inter-stage SAW filter element, and the front-end and inter-stage SAW filter elements are disposed in a cavity of the same container.

In any case, it is important to restrain floating capacitance among a plurality of SAW filter elements to prevent crosstalk from occurring. Particularly, in the weak signal extracting filter, the front-end SAW filter element and the inter-stage SAW filter element have bands of which center frequencies are approximately identical with each other, and these two SAW filter elements are required to be driven at the same time. Accordingly, it becomes important to achieve isolation (reduce crosstalk) between these two SAW filter elements as much as possible.

More specifically, an increase in crosstalk introduces the following problem. When the front-end SAW filter element and the inter-stage SAW filter element are connected in cascade to each other by external wirings, there cannot often be obtained the total attenuation amount which can theoretically be expected from the individual attenuation amounts of the two SAW filter elements. This is because the total attenuation amount of the two SAW filter elements is restricted by the crosstalk between the front-end SAW filter element and the inter-stage SAW filter element. Actually, such a device is often used with an amplifying circuit interposed between the two SAW filter elements. In such a case, too, a similar problem arises.

A method of achieving isolation between two SAW filter elements as above-mentioned is for example disclosed by Japanese Patent Laid-Open Publication No. 11-205077.

According to the technique in the Publication above-mentioned, a surface acoustic wave device is arranged such that two SAW filter elements are housed in a cavity of a container, and that the input pads, output pads, and ground pads of the container are respectively electrically connected to the input electrodes, output electrodes and ground electrodes of the SAW filter elements. It is particularly disclosed that a plurality of ground pads are disposed in the cavity of the container and that each ground electrode of one SAW filter element and each ground electrode of the other SAW filter element are respectively connected to different ground pads.

The prior art above-mentioned prescribes only the connection relationship between the SAW filter elements and the ground pads formed in the cavity.

The inventors of this application had conducted a various tests and found that there occurred crosstalk resulting from the connection means between the ground electrodes of the SAW filter elements and the ground pads of the container. More specifically, the inventors found that crosstalk occurred as resulting from not only the bonding wires, but also the shapes of ground conductor films formed on the SAW filter mounting surface of the cavity in which the SAW filter elements are mounted, and the arrangement of the ground external terminals.

(A) Ground Conductor Film

A surface acoustic wave device of prior art is shown in FIGS. 16 and 17. FIG. 16 is a perspective view of the surface acoustic wave device with its metallic lid omitted, and FIG. 17 is a perspective view thereof with SAW filter elements omitted.

Shown in FIGS. 16 and 17 are a front-end SAW filter element 100, an inter-stage SAW filter element 200, a concaved container 300, a ground pad 136 formed on a step portion of the container 300 and connected to a ground electrode 101 of the front-end SAW filter element 100 through a bonding wire, a ground pad 139 formed on a step portion of the container 300 and connected to a ground electrode 102 of the inter-stage SAW filter element 200 through a bonding wire, a ground conductor film 500 formed substantially on the entire surface of the mounting surface of a cavity 317 of the container 300, and ground external terminals 145, 146, 147, 148 formed on the external lateral sides of the container 300 and connected to a metallic lid (not shown).

As shown in FIG. 17, the ground conductor film 500 is connected to the ground pad 136 and electrically connected to the ground external terminal 145 formed on the external lateral side of the container 300. Likewise, the ground conductor film 500 is connected to the ground pad 139 and electrically connected to the ground external terminal 146. The ground conductor film 500 is connected to a ground pad 138 and electrically connected to the ground external terminal 147, and the ground conductor film 500 is connected to a ground pad 137 and electrically connected to the ground external terminal 148. The ground external terminals 145, 146, 147, 148 are respectively disposed at a plurality positions. This is for assuring the ground potential of the ground conductor film 500.

According to the arrangement above-mentioned, for example when the ground pad 136 connected to the front-end SAW filter element 100 and the ground pad 139 connected to the inter-stage SAW filter element 200, are commonly connected to the ground conductor film 500, the ground electrodes of the two SAW filter elements 100, 200 are consequently commonly connected to the ground conductor film 500 in the container 300.

When a surface acoustic wave device having this ground conductor film 500 is mounted on a circuit board (not shown), there are disadvantageously generated, between the ground potential of the ground conductor film 500 and the ground potential of the circuit board, parasitic impedances resulting from the ground external terminals 145, 146, 147, 148 and parasitic impedances resulting from the ground conductor film 500. These parasitic impedances are generated, between the ground potential of the ground conductor film 500 and the ground potential of the circuit board, through the ground conductor film 500 commonly electrically connected to the SAW filter elements 100, 200. Accordingly, the parasitic impedances generated at the side of one SAW filter element 100 also exert influence on the other SAW filter element 200.

Accordingly, the connection of the ground external terminals formed on the external sides of the container to the ground conductor film, causes the ground levels of the two SAW filter elements to be identical with each other. Therefore, even though each of the two SAW filter elements is for example connected to each peculiar ground pad as shown in Japanese Laid-Open Patent Publication No. 11-205077, the crosstalk between the SAW filter elements cannot sufficiently be restrained and stable characteristics cannot therefore be obtained.

As to why stable characteristics cannot be obtained, the following would be considered. The common ground conductor film 500 is formed in a wide area of the mounting surface of the cavity. In other words, the area of the ground conductor film 500 is basically broad. This makes it difficult to maintain the entire ground conductor film at the ground potential. Further, the broad area increases the degree to which parasitic impedances are generated.

On the other hand, Japanese Laid-Open Patent Publications Nos. 10-224175 and 10-209800 disclose a surface acoustic wave device in which the ground conductor films formed on the mounting surface of the cavity of the container, are electrically separated from one another.

However, there are disclosed (ii) a surface acoustic wave device in which the ground conductor film connected to the input side of a single SAW filter element, is separated from the ground conductor film connected to the output side of the same SAW filter element (Japanese Laid-Open Patent Publication No. 10-224175), and (ii) a surface acoustic wave device in which there are electrically separated, from each other, the ground conductor films connected to the reception and transmission sides of a comb-like electrode of a single SAW filter element (Japanese Laid-Open Patent Publication No. 10-209800). Any of the techniques above-mentioned is arranged to improve the attenuation characteristics of a signal outside of the band in a single SAW filter element. Accordingly, no prior art has been disclosed as to the technology of separating the ground conductor films from one another to prevent crosstalk among a plurality of SAW filter elements used in a single container as done in a duplexer or a weak signal extracting filter container.

It is an object of the present invention to provide a surface acoustic wave device in which the ground connection structures between the ground electrodes of SAW filter elements and the ground external terminals on the external lateral sides of a container, are independently formed, inside of the container, for the respective SAW filter elements, thereby to effectively restrain the mutual influence of parasitic impedances resulting from the ground connection structures of the SAW filter elements, resulting in stable filter characteristics.

(B) Arrangement of Ground External Terminals

In a surface acoustic wave device, the arrangement of the input and output external terminals has been decided with priority given to the convenience of a user who mounts the surface acoustic wave device on a circuit board. As a result, in a surface acoustic wave device having, in a single container, front-end and inter-stage SAW filter elements as connected in cascade to each other, an input external terminal 41 of a front-end SAW filter element 100 and an output external terminal 44 of an inter-stage SAW filter element 200, are disposed at the same lateral side of a container 300, as shown in FIG. 19.

When the input/output external terminals are disposed as shown in FIG. 19, this involves the likelihood that the cascade-connection characteristics expected from the respective filters are not sufficiently obtained even though provision as shown in Japanese Laid-Open Patent Publication No. 11-205077 is made. More specifically, the attenuation amount of electric characteristics at the time when the front-end and inter-stage SAW filter elements are connected in cascade to each other, is disadvantageously governed by crosstalk or isolation characteristics between the input external terminal of the front-end SAW filter element and the output external terminal of the inter-stage SAW filter element.

More specifically, the arrangement of the input/output external terminals as shown in FIG. 19, not only shortens the distance between the input external terminal 41 of the front-end SAW filter element 100 and the output external terminal 44 of the inter-stage SAW filter element 200, but also increases, in view of distance and arrangement, both the interference among the pads of the bonding wires inside of the container 300, and the crosstalk among the bonding wires electrically connecting the input/output electrodes of the SAW filter elements 100, 200 to the pads.

It is an object of the present invention to provide a surface acoustic wave device capable of effectively restraining the influence of crosstalk among the SAW filter elements thereby to achieve good cascade-connection attenuation characteristics, by specifying the arrangement of the input/output external terminals of the container, i.e., the arrangement of the input external terminal for the forefront SAW filter element and the output external terminal for the last-stage SAW filter element.

SUMMARY OF THE INVENTION

The present invention provides a surface acoustic wave device in which a plurality of SAW filter elements are housed in a single container, and is characterized in that ground conductor films are respectively disposed in the areas where the SAW filter elements are housed in a cavity portion, and that all the ground conductor films respectively formed in the areas where the SAW filter elements are respectively housed, are electrically separated from one another within the container.

The present invention provides a surface acoustic wave device in which a plurality of SAW filter elements are housed in a single container, and is characterized in that the container is rectangular, that a plurality of SAW filter elements are connected in cascade to one another, and that the input external terminal electrically connected to the forefront SAW filter element out of the cascade-connected SAW filter elements, is formed at or in the vicinity of a first corner portion of the outer peripheral surface of the container, and the output external terminal electrically connected to the last-stage SAW filter element is formed at or in the vicinity of a second corner portion which is located in a diagonal direction with respect to the first corner portion.

The present invention provides a surface acoustic wave device capable of considerably reducing crosstalk between two SAW filter elements.

The following description will discuss specific arrangements of the present invention with reference to the attached drawings.

DESCRIPTION OF THE PREFERRED EMBODIMENTS

The following description will discuss, as an embodiment of the surface acoustic wave device of the present invention, a weak signal extracting filter. Examples of a weak signal include a signal transmitted onto the earth from an artificial satellite or the like.

First Embodiment

Figure 1:
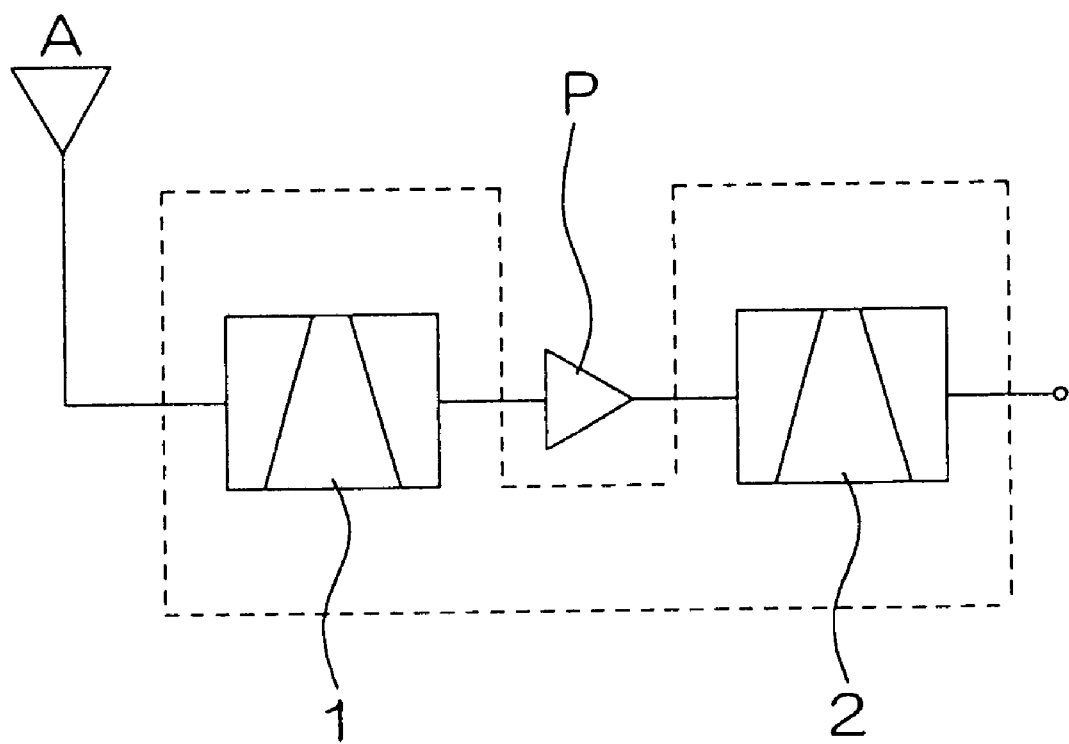
FIG. 1 is a circuit diagram illustrating a connection structure of a weak signal extracting filter.

As shown in FIG. 1, a weak signal extracting filter is connected to an antenna circuit A and is used together with an amplifying circuit P. More specifically, the antenna circuit A is connected, in cascade, to a front-end SAW filter element through which a specific frequency band can pass (hereinafter simply referred to as a front-end SAW filter element) 1, the amplifying circuit P for amplifying a signal of this specific frequency, and an inter-stage SAW filter element for extracting an amplified signal (hereinafter simply referred to as an inter-stage SAW filter element) 2. With the arrangement above-mentioned, there is obtained, from a weak signal, a level signal in which a noise element is restrained and which is amplified to such an extent as to be processed by a normal switch circuit or a reception circuit.

In the arrangement of such a weak signal extracting filter, at least the amplifying circuit P is handled as a separate part of an IC chip or the like. The front-end SAW filter element 1 and the inter-stage SAW filter element 2 are handled as a single part as housed in a single container.

Figure 2:
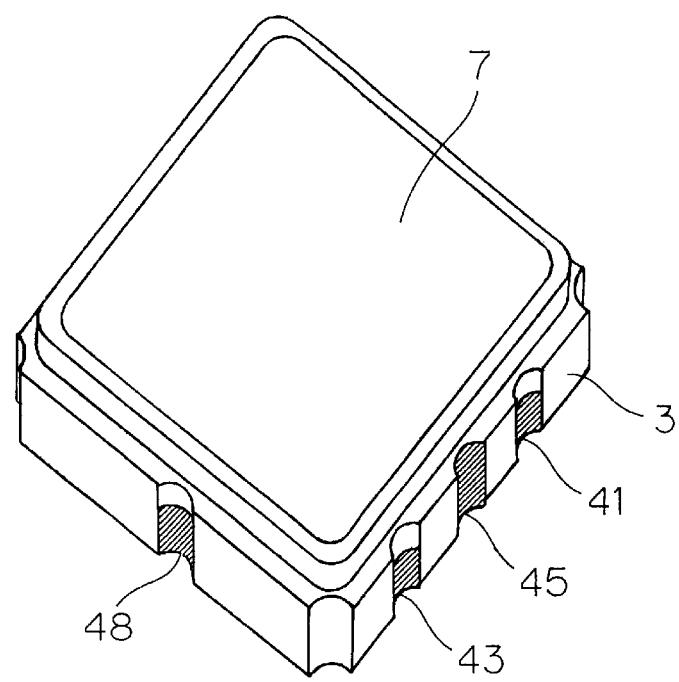
FIG. 2 is a perspective view of a weak signal extracting filter as an embodiment of a surface acoustic wave device of the present invention.
Figure 3:
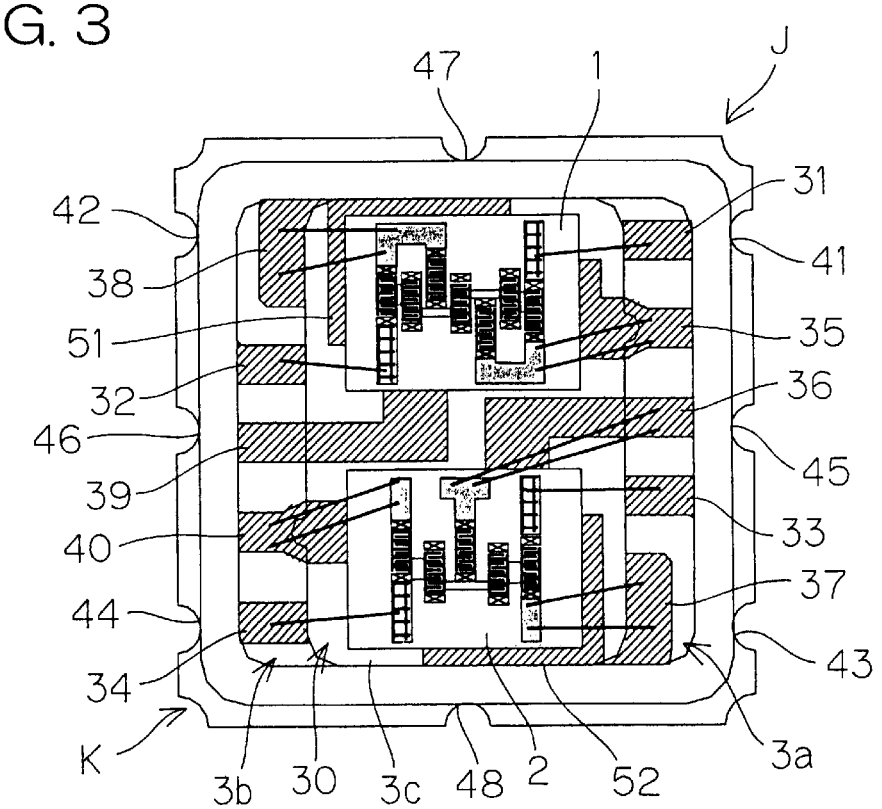
FIG. 3 is a plan view of the weak signal extracting filter with its metallic lid omitted, particularly illustrating the relationship between the SAW elements and the pads.
Figure 5A:
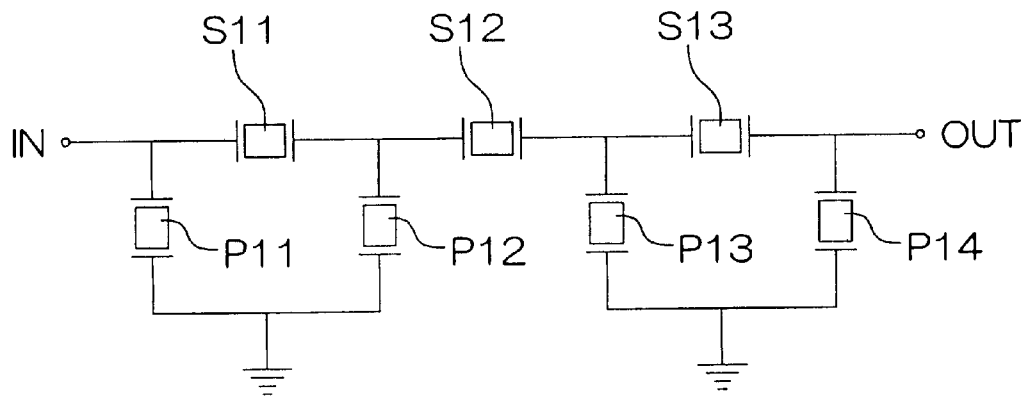
FIG. 5A is an equivalent circuit diagram of the SAW element shown in FIG. 4A.
Figure 5B:
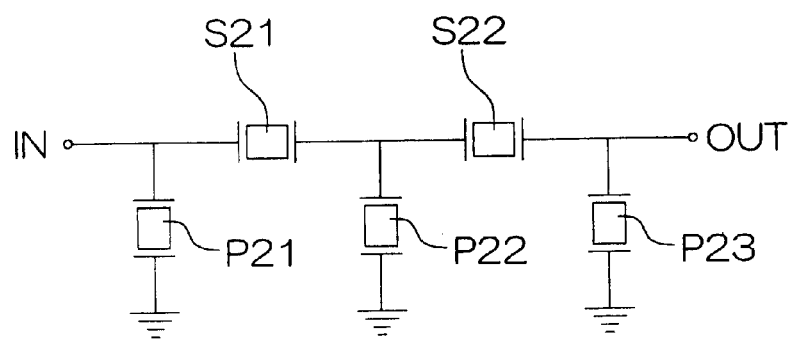
FIG. 5B is an equivalent circuit diagram of the SAW element shown in FIG. 4B.
Figure 6:
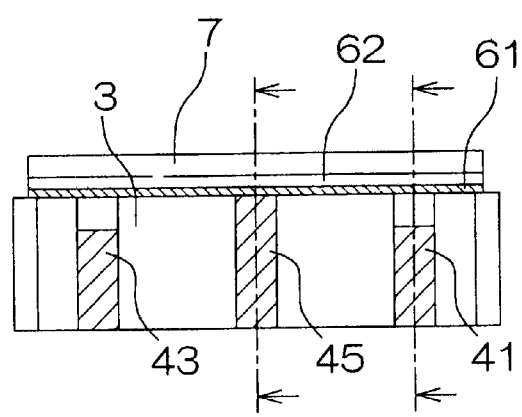
FIG. 6 is a side view of the weak signal extracting filter container at one lateral side thereof.
Figure 7:
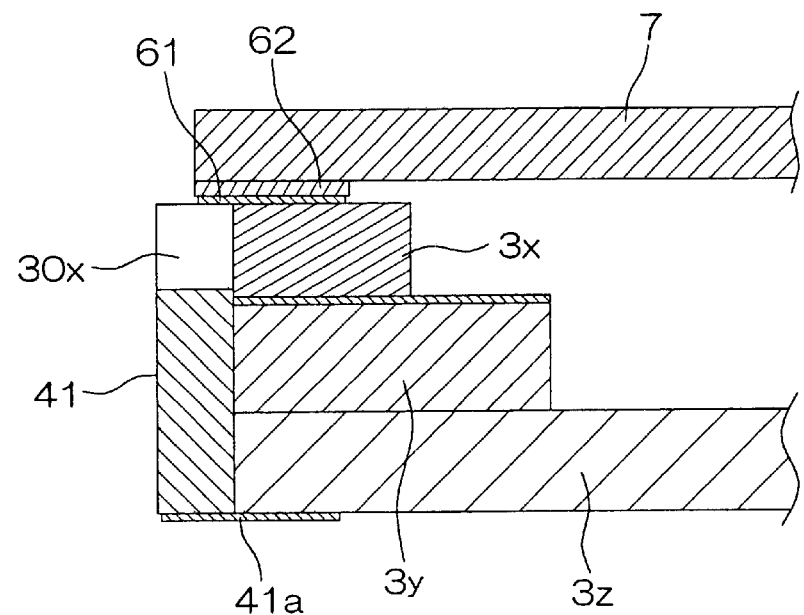
FIG. 7 is a section view of the weak signal extracting filter at its input/output external terminal portion.
Figure 8A:
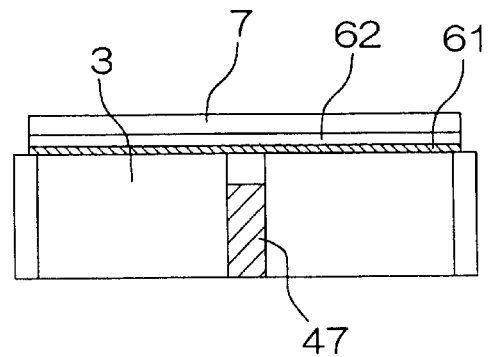
FIG. 8A is a side view of the weak signal extracting filter container at other lateral side thereof.
Figure 9:
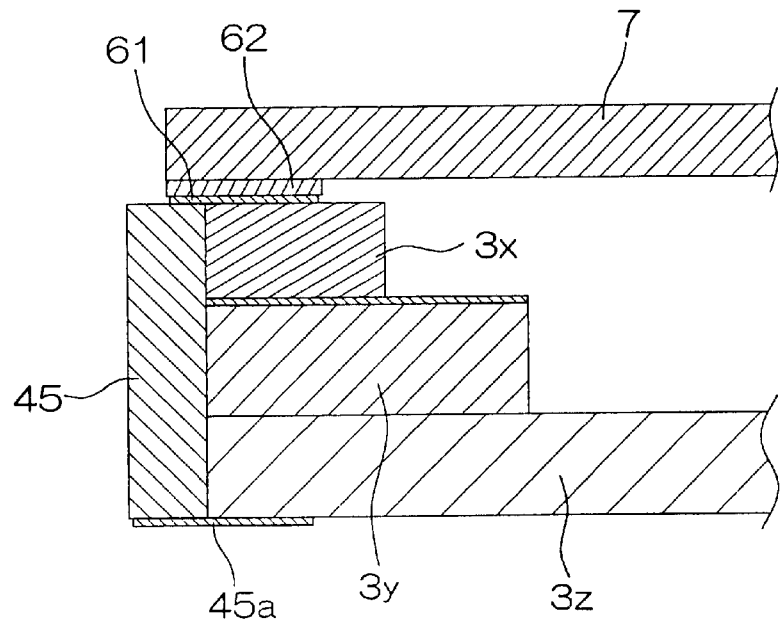
FIG. 9 is a section view of the weak signal extracting filter at its ground external terminal portion.

FIG. 2 is a perspective view of a weak signal extracting filter according to a first embodiment of the present invention. FIG. 3 is a plan view of the weak signal extracting filter with its metallic lid omitted. Each of FIGS. 7 and 9 is a section view illustrating the sectional structure of a container. Each of FIGS. 6 and 8A is a side view of main portions of the container. Each of FIGS. 5A and 5B is an equivalent circuit diagram of a SAW filter element.

In FIG. 2, the weak signal extracting filter comprises a container 3 and a metallic lid 7 hermetically sealed to the top of the container 3. Formed in the four external lateral sides of the container 3 are for example eight grooves (three in each of a pair of opposite sides and one in each of another pair of opposite sides) for forming external terminals and having a semicircular shape in plan elevation.

These semicircular grooves for forming external terminals extend in the thickness direction of the container 3, and external terminals 41 to 48 are formed inside of these grooves. For example, there are formed, in one side of a pair of opposite external lateral sides, the front-end input external terminal 41 electrically connected to the front-end SAW filter element input pad, the ground external terminal 45 electrically connected to an inter-stage SAW filter element ground pad, and the inter-stage input external terminal 43 electrically connected to the inter-stage SAW filter element input pad.

Further, there are formed, in the other side of the pair of opposite external lateral sides, the front-end output external terminal 42 electrically connected to the front-end SAW filter element output pad, the ground external terminal 46 electrically connected to an front-end SAW filter element ground pad, and the inter-stage output external terminal 44 electrically connected to the inter-stage SAW filter element output pad.

Further disposed in one side of another pair of opposite sides is the ground external terminal 47 electrically connected to a front-end SAW filter element ground pad. Disposed on the other side of another pair of opposite sides is the ground external terminal 48 electrically connected to an inter-stage SAW filter element ground pad.

As shown in FIG. 3, there is disposed, in the container 3, a cavity portion 30 having a mounting surface 3c on which the two SAW filter elements 1 and 2 are to be mounted, and step portions 3a, 3b at both sides. On the mounting surface 3c, the SAW filter elements 1 and 2 are disposed.

Successively from the up side to the down side of FIG. 3, there are disposed, on the step portion 3a of the cavity portion 30, an input pad 31 to be connected to the input electrode of the front-end SAW filter element 1, a ground pad 35 to be connected to a ground electrode of the front-end SAW filter element 1, a ground pad 36 to be connected to a ground electrode of the inter-stage SAW filter element 2, an input pad 33 to be connected to the input electrode of the inter-stage SAW filter element 2, and a ground pad 37 to be connected to a ground electrode of the inter-stage SAW filter element 2.

Successively from the up side to the down side of FIG. 3, there are disposed, on the other step portion 3b, a ground pad 38 to be connected to a ground electrode of the front-end SAW filter element 1, an output pad 32 to be connected to the output electrode of the front-end SAW filter element 1, a ground pad 39 to be connected to a ground electrode of the front-end SAW filter element 1, a ground pad 40 to be connected to a ground electrode of the inter-stage SAW filter element 2, and an output pad 34 to be connected to the output electrode of the inter-stage SAW filter element 2.

Figure 4A:
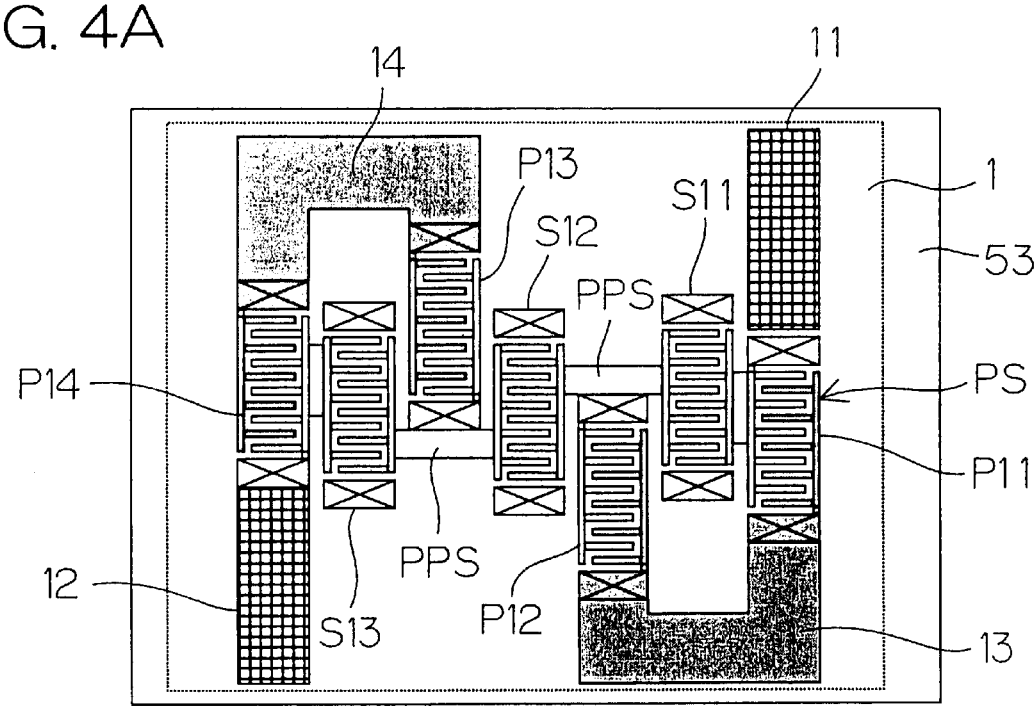
FIG. 4A is a plan view of the electrode pattern of a SAW element used for the weak signal extracting filter.

The input electrode 11 shown in FIG. 4A of the front-end SAW filter element 1 is connected, through a bonding wire, to the input pad 31 formed on the right-hand step portion 3a in FIG. 3, and the output electrode 12 is connected, through a bonding wire, to the output pad 32 formed on the left-hand step portion 3b. A ground electrode 13 is connected, through a bonding wire, to the ground pad 35 on the step portion 3a, and a ground electrode 14 is connected, through a bonding wire, to the ground pad 38 on the step portion 3b.

Figure 4B:
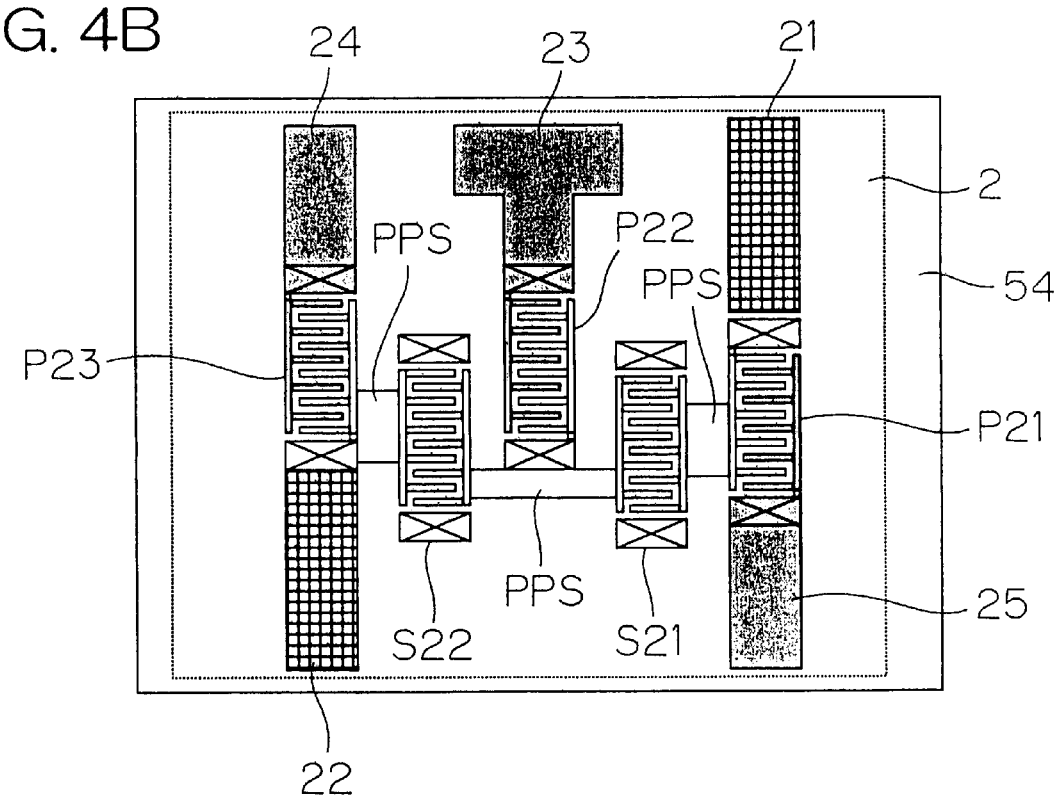
FIG. 4B is a plan view of the electrode pattern of another SAW element used for the weak signal extracting filter.

The input electrode 21 shown in FIG. 4B of the inter-stage SAW filter element 2 is connected, through a bonding wire, to the input pad 33 formed on the right-hand step portion 3a in FIG. 3, and the output electrode 22 is connected, through a bonding wire, to the output pad 34 formed on the left-hand step portion 3b. A ground electrode 23 is connected, through a bonding wire, to the ground pad 36 on the step portion 3a, and a ground electrode 24 is connected, through a bonding wire, to the ground pad 40 on the step portion 3b. A ground electrode 25 is connected, through a bonding wire, to the ground pad 37 formed on the step portion 3a.

Each of the SAW filter elements 1, 2 comprises a piezoelectric substrate 53, 54 of lithium tantalate (LiTaO$_3$), lithium niobate (LiNbO$_3$), quartz crystal or the like, on the surface of which there are formed inter-digital electrodes PS composed of a set of mutually meshing comb-like electrode fingers, connection conductors PPS, the input electrode 11, 21, the output electrode 12, 22, the ground electrodes 13, 14; 23, 24, 25, and reflector electrodes as necessary (generally designated by × in FIG. 4).

An inter-digital electrode PS forms one resonance section. The resonance sections are classified as series resonance sections and parallel resonance sections, which are connected to each other through connection conductors.

In the front-end SAW filter element 1 shown in FIG. 4A, three series resonance sections S11 to S13 and four parallel resonance sections P11 to P14 are connected, on the piezoelectric substrate 53, in the form of a ladder by the connection conductors PPS. FIG. 5A shows an equivalent circuit diagram of the arrangement shown in FIG. 4A.

One input electrode 11, one output electrode 12 and two ground electrodes 13, 14 are formed as attached to the SAW filter element 1.

In the inter-stage SAW filter element 2 shown in FIG. 4B, two series resonance sections S21 to S22 and three parallel resonance sections P21 to P23 are connected, on the piezoelectric substrate 54, in the form of a ladder by the connection conductors PPS. FIG. 5B shows an equivalent circuit diagram of the arrangement shown in FIG. 4B.

One input electrode 21, one output electrode 22 and three ground electrodes 23, 24, 25 are formed as attached to the SAW filter element 2.

The front-end SAW filter element 1 and the inter-stage SAW filter element 2 are slightly different from each other in the number of connection stages with the passage band characteristics and selectivity taken into consideration.

These SAW filter elements 1, 2 are respectively bonded, through insulating adhesives, to ground conductor films 51, 52 (FIG. 11A) on the mounting surface 3c of the cavity portion 30.

As shown in FIG. 6, the external terminals 41, 45, 43 of the container 3 are formed, in the thickness direction of the container 3 (vertical direction of the drawing paper surface), on one side of a pair of external lateral sides of the container 3. In the external terminals 41, 45, 43, conductors extend, inside of the grooves having a semicircular section, from the bottom to predetermined positions. For example, the input external terminal 41 to be connected to the input electrode 11 (See FIG. 4A) of the front-end SAW filter element 1 and the input external terminal 43 to be connected to the input electrode 21 (See FIG. 4B) of the inter-stage SAW filter element 2, extend from the bottom of the container 3 to the intermediate position in the depth direction of the container 3. The ground external terminal 45 located substantially in the center in the width direction of the external lateral side of the container 3, extends from the bottom of the container 3 toward the top of the container 3 throughout the depth direction thereof. The ground external terminal 45 is electrically connected to a seal-ring connecting conductor film 61 formed on the top of the container 3.

Likewise in FIG. 6, on the other external lateral side of the container 3 (not shown), the output external terminals 42, 44 extend from the bottom of the container to intermediate positions in the depth direction, and the ground external terminal 46 extends from the bottom to the top of the container 3 and is electrically connected to the seal-ring connecting conductor film 61 formed on the top of the container 3.

FIG. 8A is a side view of an external lateral side of the container 3 as viewed from a position displaced at an angle of 90° from the visual position of FIG. 6. Only the ground external terminal 47 is formed on this external lateral side. On the external lateral side of the container 3 opposite to this external lateral side, only the ground external terminal 48 is formed.

Each of FIGS. 7 and 9 is a section view of the container 3. Shown in FIGS. 7 and 9 are the seal-ring connecting conductor film 61 (ground potential) as mentioned earlier, a seal ring 62 and the metallic lid 7.

As shown in FIGS. 7 and 9, the container 3 is formed by at least three ceramic layers. The uppermost ceramic layer 3x is made in the form of a ring for forming an opening of the cavity portion 30 (See FIG. 3). Attached to the entire top of the ceramic layer 3x is the conductor film 61 to which the seal ring 62 made of kovar, a 42-alloy or the like, is bonded by brazing.

As shown in FIG. 7, a conductor film serving as the input external terminal 41 for example, is not attached to a groove 30x formed in the uppermost ceramic layer 3x. Such an arrangement is applied also to other input/output external terminals 42, 43, 44.

As shown in FIG. 9, as to each ground external terminal 45, 46, a conductor film is formed throughout the thickness direction of all the three ceramic layers 3x, 3y, 3z. As shown in FIG. 8A, a conductor film is not attached to a groove formed in the ceramic layer 3x for each ground external terminal 47, 48. This reason will be discussed later.

Figure 10:
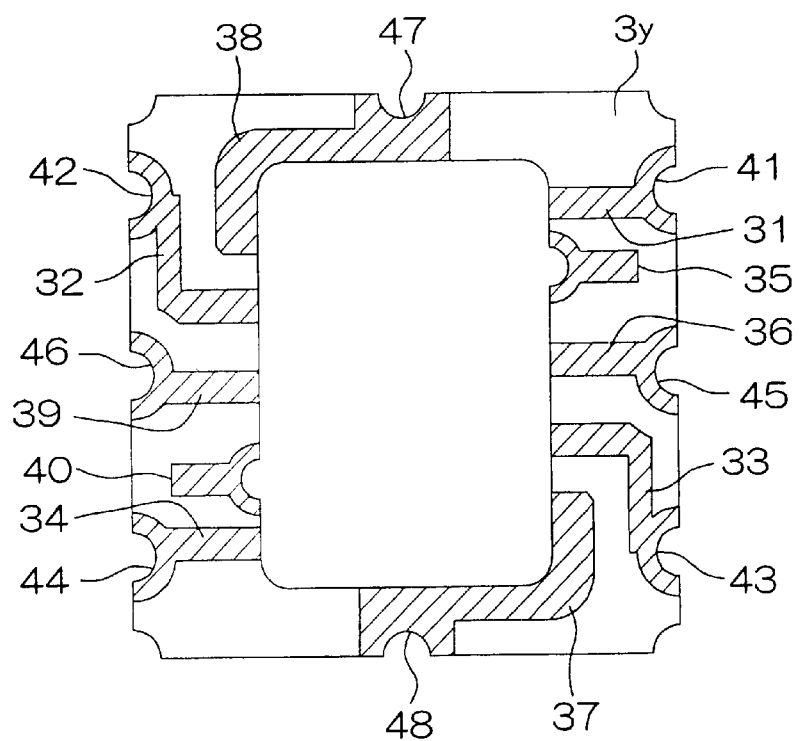
FIG. 10 is a plan view of an intermediate ceramic layer of the weak signal extracting filter container.

FIG. 10 is a plan view of the intermediate ceramic layer 3y. On the ceramic layer 3y, the step portions 3a, 3b are formed in the inner wall of the cavity portion 30 (See FIG. 3). Accordingly, the ceramic layer 3y is made in the form of a ring having an opening relatively smaller than the opening of the cavity portion 30. Formed in the outer periphery of the ceramic layer 3y are eight semicircular concave portions which serve as grooves in the external lateral sides of the container 3 for assuring the areas in which the external terminals are formed. Respectively formed in the concave portions are a conductor film serving as the input external terminal 41 of the front-end SAW filter element, a conductor film serving as the ground external terminal 45, a conductor film serving as the input external terminal 43 of the inter-stage SAW filter element, a conductor film serving as the ground external terminal 48, a conductor film serving as the output external terminal 44 of the inter-stage SAW filter element, a conductor film serving as the ground external terminal 46, a conductor film serving as the output external terminal 42 of the front-end SAW filter element, and a conductor film serving as the ground external terminal 47.

Also formed around the opening of the ceramic layer 3y are conductor films serving as the input pads 31, 33 respectively connected to the input electrodes 11, 21 of the SAW filter elements, conductor films serving as the output pads 32, 34 respectively connected to the output electrodes 12, 22, and conductor films serving as ground pads 35, 38, 36, 40, 37 respectively connected to the ground electrodes 13, 14, 23, 24, 25.

The step portion 3a is formed due to the difference between the opening of the uppermost ceramic layer 3x and the opening of the intermediate ceramic layer 3y. Formed on the right portion in FIG. 10 corresponding to the step portion 3a in FIG. 3 are a conductor film serving as the input pad 31 connected to the input electrode of the front-end SAW filter element 1, a conductor film serving as the ground pad 35 connected to the ground electrode of the front-end SAW filter element 1, a conductor film serving as the ground pad 36 connected to the ground electrode of the inter-stage SAW filter element 2, a conductor film serving as the input pad 33 connected to the input electrode of the inter-stage SAW filter element 2, and a conductor film serving as the ground pad 37 connected to the ground electrode of the inter-stage SAW filter element 2. Out of these five pads, the conductor film serving as the input pad 31 connected to the input electrode 11 of the front-end SAW filter element 1, extends outwardly of this side and is electrically connected to the conductor film serving as the input external terminal 41 in the groove. The conductor film serving as the ground pad 36 connected to the ground electrode 23 of the inter-stage SAW filter element 2, extends outwardly of this side and is electrically connected to the conductor film serving as the ground external terminal 45 in the groove. The conductor film serving as the input pad 33 connected to the input electrode 21 of the inter-stage SAW filter element 2, extends outwardly of this side and is electrically connected to the conductor film serving as the input external terminal 43 in the groove. The conductor film serving as the ground pad 37 connected to the ground electrode 25 of the inter-stage SAW filter element 2, is electrically connected to the conductor film serving as the ground external terminal 48 in the groove formed in the different side.

The ground pad 35 which is the second pad on the step portion 3a from above and which is connected to the ground electrode 13 of the front-end SAW filter element, extends inwardly of the step portion 3a and terminates in a semicircular concave portion formed in the inner wall of the step portion 3a.

In the pads on the left portion in FIG. 10 corresponding to the step portion 3b in FIG. 3, the ground pad 38 connected to the ground electrode 14 of the front-end SAW filter element 1, is electrically connected to the conductor film serving as the ground external terminal 47 in the groove formed in the different side. The conductor film serving as the output pad 32 connected to the output electrode 12 of the front-end SAW filter element 1, extends outwardly of this side and is electrically connected, as it is, to the conductor film serving as the output external terminal 42 in the groove in the left side in FIG. 10. The conductor film serving as the output pad 34 connected to the output electrode 22 of the inter-stage SAW filter element 2, extends outwardly of this side and is electrically connected, as it is, to the conductor film serving as the output external terminal 44 in the groove in the left side in FIG. 10.

The ground pad 39 is electrically connected, as it is, to the conductor film serving as the ground external terminal 46 in the groove in the left side in FIG. 10. The ground pad 40 extends inwardly of the step portion 3b and terminates in the semicircular groove formed in the inner wall of the step portion 3b.

Figure 11A:
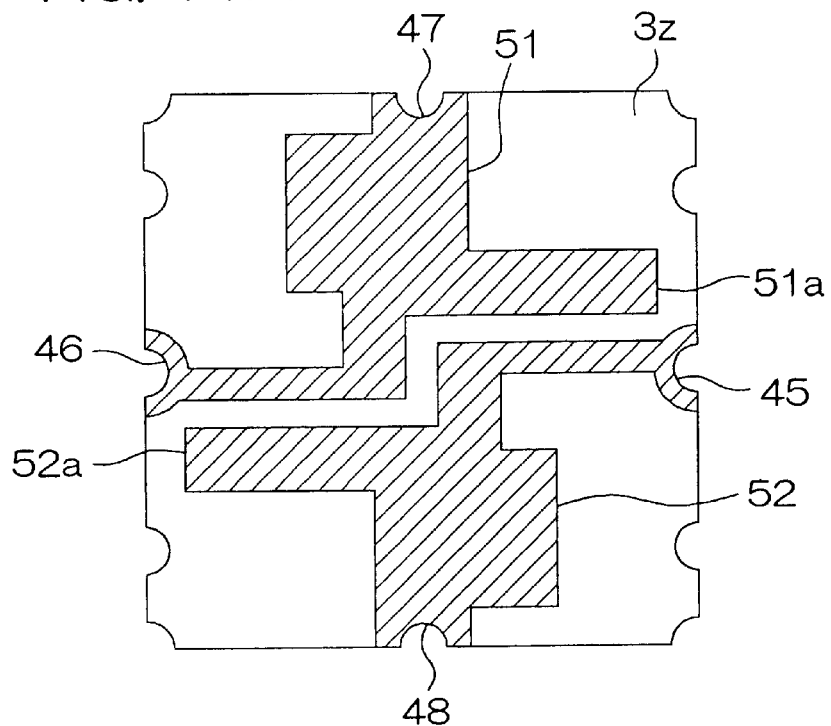
FIG. 11A is a plan view of the lowermost ceramic layer of the weak signal extracting filter container.

FIG. 11A is a plan view of the lowermost ceramic layer 3z. The ceramic layer 3z is flat and has eight concave portions in the outer periphery likewise the ceramic layers 3x, 3y. Conductor films serving as the external terminals are formed inside of the concave portions.

Two ground conductor films 51, 52 are formed on the top of the ceramic layer 3z serving as the mounting surface of the cavity portion 30. One ground conductor film 51 is formed substantially in the area where the front-end SAW filter element 1 is mounted, and the other ground conductor film 52 is formed substantially in the area where the inter-stage SAW filter element 2 is mounted. The ground conductor films 51, 52 are not connected to each other.

The ground conductor film 51 to which the front-end SAW filter element 1 is bonded, extends to the lower portion of the concave portion in which the second ground pad 35 of the right-hand step portion 3a in FIG. 3 terminates, such that the ground conductor film 51 is connected to the ground pad 35(See an extending portion 51a). The ground conductor film 51 extends to the concave portion formed in the upper side in FIG. 11A, and is electrically connected, through a low impedance portion, to the conductor film serving as the ground external terminal 47. Further, the ground conductor film 51 extends to the concave portion formed in the center of the left side in FIG. 11A, and is electrically connected to the ground external terminal 46 through a high impedance portion. More specifically, the ground conductor film 51 is connected, for example, to the ground external terminals 46, 47 respectively formed in different sides of the container 3. Accordingly, the ground conductor film 51 is grounded to the ground potential in different directions.

The ground conductor film 52 to which the inter-stage SAW filter element 2 is bonded, extends to the lower portion of the concave portion of the fourth ground pad 40 on the step portion 3b in FIG. 3, such that the ground conductor film 52 is connected to the ground pad 40 (See an extending portion 52a). The ground conductor film 52 extends to the concave portion formed in the lower side in FIG. 11A, and is electrically connected, through a low impedance portion, to the conductor film serving as the ground external terminal 48.

Further, the ground conductor film 52 extends to the concave portion formed in the center of the right side in FIG. 11A, and is electrically connected to the ground external terminal 45 through a high impedance portion. More specifically, the ground conductor film 52 is connected, for example, to the ground external terminals 48, 45 respectively formed in different sides of the container 3, likewise the ground conductor film 51. Accordingly, the ground conductor film 52 is grounded to the ground potential in different directions.

The high impedance portion above-mentioned is defined as a portion in which a weak electric current flowing from the ground conductor films 51, 52 to the ground external terminals, is substantially restrained, and the low impedance portion above-mentioned is defined as a portion in which a weak electric current flowing from the ground conductor films 51, 52 to the ground external terminals, is not substantially restrained.

Figure 12:
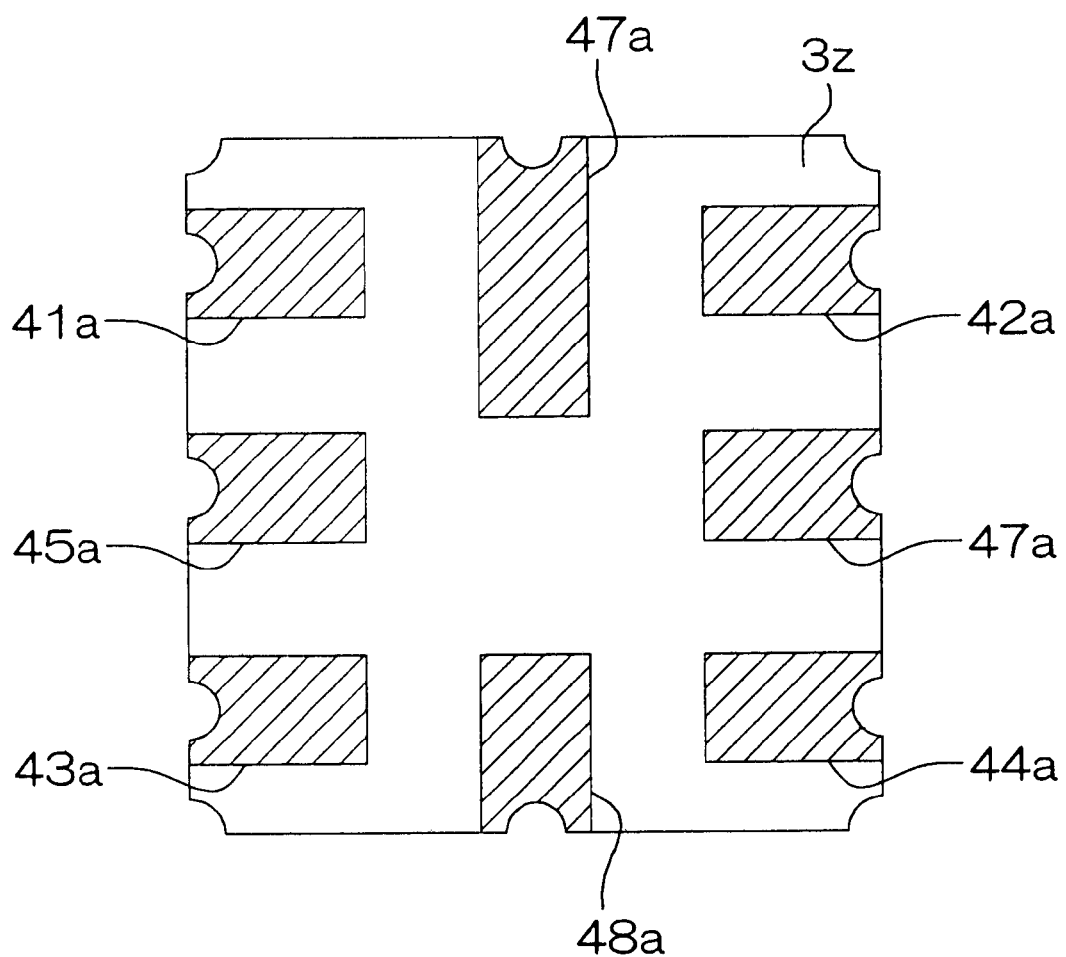
FIG. 12 is a bottom view of the lowermost ceramic layer of the weak signal extracting filter container.

FIG. 12 is a bottom view of the ceramic layer 3z. Attached to the underside of the ceramic layer 3z are flat terminal electrodes 41a to 48a respectively electrically connected to the terminal electrodes 41 to 48.

The container 3 having the arrangement above-mentioned is made for example by successively laminating three types ceramic green sheets. More specifically, through-holes resulting in the grooves are formed in the predetermined positions of the sheets respectively serving as the uppermost ceramic layer 3x, the intermediate ceramic layer 3y and the lowermost ceramic layer 3z, and conductive paste is applied onto the sheet and the inner surfaces of the through-holes. Openings for forming the cavity portion, are formed in the sheets serving as the uppermost ceramic layer 3x and the intermediate ceramic layer 3y.

These ceramic sheets are then made in a unitary structure in lamination, calcined and divided or cut into the shape of the container 3, thus obtaining the container 3. It is noted that dividing or cutting may be executed before the calcining process.

Examples of the conductor film material include W(tungsten), Mo(molybdenum), Ag, Cu and the like. The metal to be used depends on the ceramic material (The calcination temperature and the calcination atmosphere vary with the ceramic material). When the ceramic material is alumina, W(tungsten) or Mo(molybdenum) may be used as the conductor material. When the ceramic material is a glass-ceramic material, Ag or Cu may be used as the conductor material. When Cu is used, calcination is conducted in a reduction atmosphere.

Ni plating or Au plating is applied to the surfaces of the pads 31 to 40 and the external terminals 41 to 48 exposed from the container 3. This not only facilitates bonding of the pads 31 to 40 with the use of bonding wires, but also facilitates bonding of the external terminals 41 to 48 to soldering or the like. Further, the conductor film 61 on the top of the container 3 can readily and securely be bonded to the seal ring by brazing.

The seal ring 62 is bonded, by brazing, to the top of the conductor film 61 (electrically connected to ground external terminals formed at the lateral sides of the container 3) formed on the surface of the container 3 comprising the three ceramic layers 3x to 3y above-mentioned. Thus, the container 3 is completed in its entirety.

As mentioned earlier, in the cavity portion 30 of the container 3, the front-end and inter-stage SAW filter elements 1, 2 are respectively bonded to the ground conductor films 51, 52 through adhesives, and are connected to each other through wire bondings of Au or the like.

In the manner above-mentioned, the front-end and inter-stage SAW filter elements 1, 2 are housed in the cavity portion 30 of the container 3. The metallic lid 7 is placed on the seal ring 62 put on the circumference of the opening outside of the cavity portion 30, and seam welding is conducted by supplying a predetermined electric current to the bonding portions between the metallic lid 7 and the seal ring 62.

The metallic lid 7 is made of a metallic flat plate of kovar or a 42-alloy, and is provided on the SAW element mounting surface thereof with an Ag layer. The metallic lid 7 is substantially grounded to the ground potential through the ground external terminals 45 to 48 disposed at the external lateral sides of the container 3.

In the weak signal extracting filter having the arrangement above-mentioned, out of the ground external terminals 45 to 48, the opposite ground external terminals 45, 46 disposed at the partitioning position between the two SAW filter elements, are electrically connected to the metallic lid 7 outside of the container 3. The ground pads 35 to 40 are not shared with the SAW filter elements 1, 2, and the ground potentials of the ground pads 35 to 40 connected to the SAW filter elements 1, 2, are electrically separated from each other inside of the container 3.

The following description will discuss the electrical connection between the ground external terminals 45 to 48 and the ground conductor films 51, 52 and the electrical connection between the ground external terminals 45 to 48 and the metallic lid 7.

The ground external terminals 45, 46 are connected to the metallic lid 7 only through the high impedance portions of the ground conductor films 51, 52. The high impedance portions restrain the flowing electric currents such that the metallic lid 7 is securely dropped to the ground potential. Thus formed on the metallic lid 7 is potential which is near to the ideal ground potential, such that the metallic lid 7 has shield effects. Accordingly, the crosstalk between the SAW filter elements 1, 2 through the metallic lid 7, can be restrained. Further, as shown in FIG. 11A, the ground external terminals 45, 46 are disposed at the opposite sides on the virtual line which partitions the two SAW filter elements. Therefore, potential near to the ideal ground potential is formed on the partition portion. Thus, the parasitic impedances of the SAW filter elements 1, 2 on the metallic lid 7, can be cut off at the partition portion, further enhancing the shield effect between the SAW filter elements 1, 2.

On the other hand, the ground external terminals 47, 48 are connected to the low impedance portions of the ground conductor films 51, 52, and are not connected to the metallic lid 7. Accordingly, the ground external terminals 47, 48 mainly play a role of dropping only the potentials of the ground conductor films 51, 52 to the ground potential. Therefore, the ground potentials of the ground conductor films 51, 52 are securely maintained.

In prior art, all the ground external terminals 45 to 48 are connected to the metallic lid 7. Accordingly, the potentials of the connection portions of the ground conductor films 51, 52 to the ground external terminals 45 to 48, are dropped to the ground potential through the same passage through which the potential of the metallic lid 7 is dropped to the ground potential. Therefore, the ground conductor films 51, 52 cannot sufficiently be dropped to the ground potential and the metallic lid 7 cannot provide a sufficient shield effect. As a result, there easily appear influences due to a difference in potential between the ground conductor films 51, 52 and the mounted circuit board (not shown).

Figure 20:
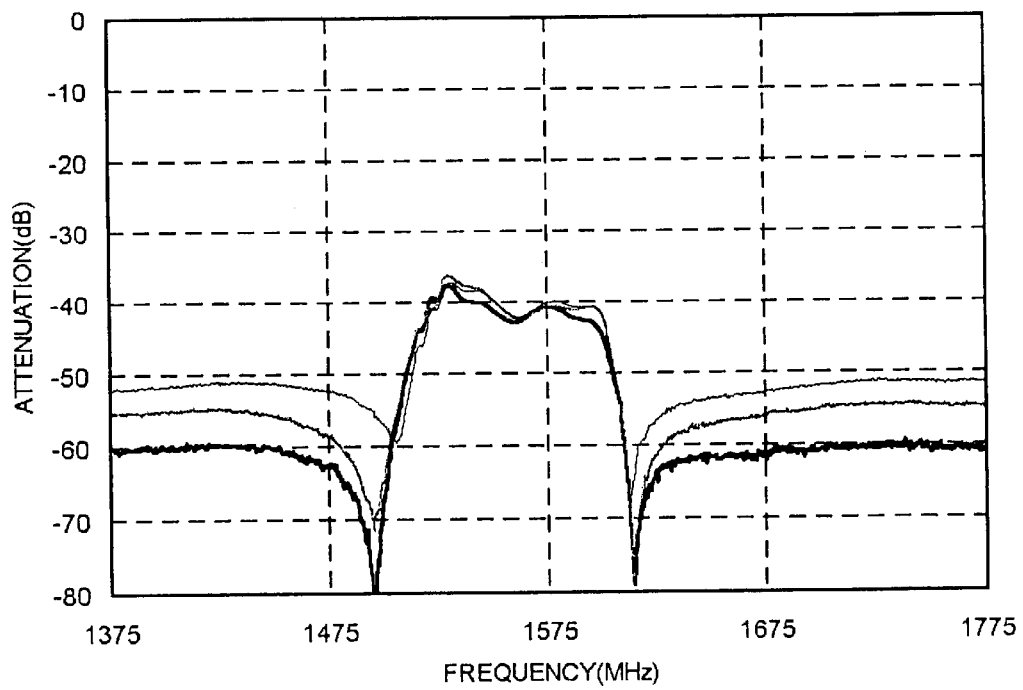
FIG. 20 is a graph illustrating the isolation characteristics of the weak signal extracting filter shown in FIGS. 2 and 3, and the isolation characteristics of a weak signal extracting filter of Comparative Example.

To confirm these effects, the inventors of this application actually measured the isolation characteristics. FIG. 20 shows the measured results of isolation characteristics.

In FIG. 20, a thick solid line shows the isolation characteristics of a weak signal extracting filter having the arrangement discussed in connection with the first embodiment. A thin solid line shows the isolation characteristics of a weak signal extracting filter having an arrangement similar to that of the first embodiment, except that all the ground external terminals 45 to 48 were connected to the metallic lid 7. A broken line shows the isolation characteristics of a weak signal extracting filter having an arrangement similar to that of the first embodiment, except that only the ground external terminals 45, 46, 47 were connected to the metallic lid 7.

The thick solid line shows the most preferable isolation characteristics, and the broken line shows the second preferable isolation characteristics. The thin solid line of the weak signal extracting filter in which all the ground external terminals were connected to the metallic lid 7, shows the worst isolation characteristics. This is the results as previously expected.

As discussed in the foregoing, the weak signal extracting filter of the first embodiment is arranged such that the ground conductor films 51, 52 respectively having the SAW filter elements 1, 2 mounted thereon, are not connected to each other in the cavity portion 30 of the container 3, but are connected to the ground external terminals 45 to 48.

Figure 13:
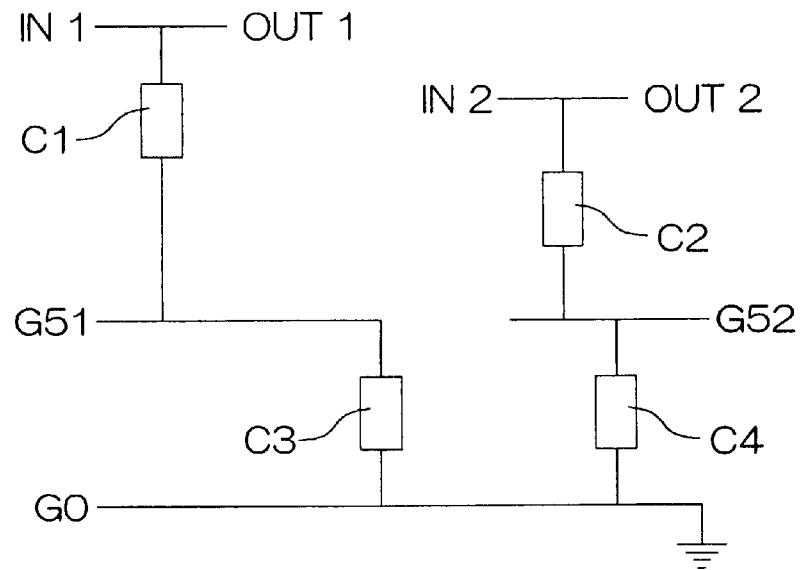
FIG. 13 is an equivalent circuit diagram illustrating parasitic impedance elements generated on the ground conductor films of the weak signal extracting filter.
Figure 14:
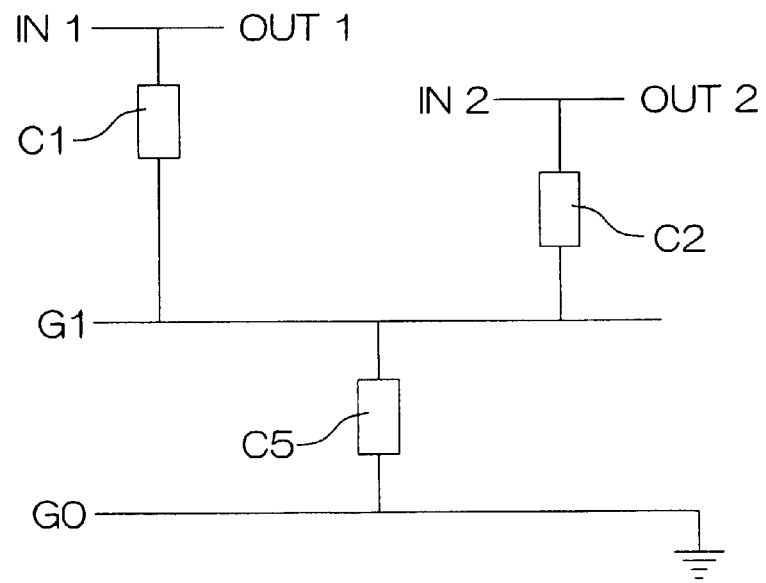
FIG. 14 is an equivalent circuit diagram illustrating parasitic impedance elements generated on a common ground conductor film of a weak signal extracting filter of prior art.
Figure 17:
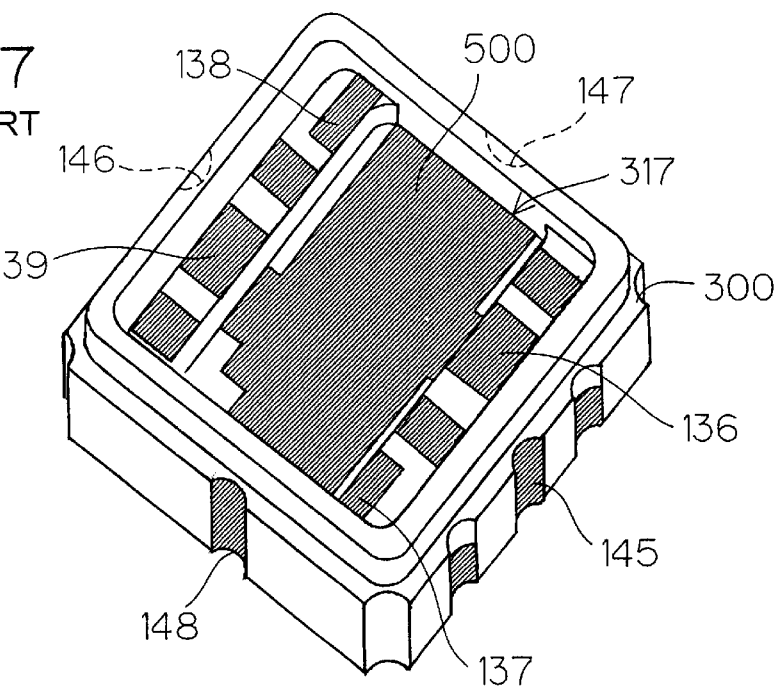
FIG. 17 is a perspective view of the weak signal extracting filter of prior art with its metallic lid and SAW elements omitted, particularly illustrating a ground conductor film.

The following description will discuss an equivalent circuit in which consideration is taken on parasitic impedance between each of the SAW filter elements 1, 2 and the ground potential of the mounted circuit board. FIG. 13 is an equivalent circuit diagram illustrating parasitic impedance around the ground conductor films 51, 52 in the weak signal extracting filter. FIG. 14 is an equivalent circuit diagram illustrating parasitic impedance of a weak signal extracting filter of prior art in which, as shown in FIG. 17, a ground conductor film 500 is formed, as extending over two SAW filter elements 100, 200, on the mounting surface of a cavity 317.

In the front-end SAW filter element 1 shown in FIGS. 3 and 4, the ground electrodes 13, 14 are connected, through the ground pads 35, 38, to the ground conductor film 51 dedicated to the front-end SAW filter element 1, and also connected to the ground potential of the circuit board through the ground external terminals 46, 47.

In the inter-stage SAW filter element 2, the ground electrodes 23, 24, 25 are connected, through the ground pads 36, 40, 37, to the ground conductor film 52 dedicated to the inter-stage SAW filter element 2, and connected to the ground potential of the circuit board through the ground external terminals 45, 48.

Accordingly, respective parasitic impedances C1, C2 are independently generated between IN-OUT lines of the SAW filter elements 1, 2 and ground potentials G51, G52 of the ground conductor films 51, 52.

Respective parasitic impedances C3, C4 resulting from the ground conductor films 51, 52 are independently generated between the ground potentials G51, G52 of the ground conductor films 51, 52 and the ground potential G0 of the circuit board.

The parasitic impedance element C3 resulting from the ground conductor film 51 dedicated to the front-end SAW filter element 1, affects only the front-end SAW filter element 1 but does not affect the other inter-stage SAW filter element 2. Likewise, the parasitic impedance C4 resulting from the ground conductor film 52 dedicated to the inter-stage SAW filter element 2, does not affect the front-end SAW filter element 1.

In the prior art, however, the ground conductor film 500 is formed as extending over the entire top surface of the lowermost ceramic layer as shown in FIG. 17, and the ground potentials of the SAW filter elements 1, 2 are connected through this ground conductor film 500.

FIG. 14 shows an equivalent circuit relating to the parasitic impedance in the arrangement of prior art. In the equivalent circuit in FIG. 14, parasitic impedance C5 resulting from the common ground conductor film, is commonly generated between the ground potential of ground conductor film G1 and the ground potential of circuit board G0.

This parasitic impedance C5 disadvantageously affects both the front-end SAW filter element 1 and the inter-stage SAW filter element 2. Further, the ground conductor film 500 is formed as extending over both areas of the two SAW filter elements. The ground conductor film 500 is simply nearly doubled in area as compared with each ground conductor film of the present invention. Accordingly, the parasitic capacitance is nearly doubled with respect to one SAW filter element.

This results in deterioration of the isolation characteristics between the two SAW filter elements.

The inventors of this application actually measured the isolation characteristics of weak signal extracting filter devices each having the front-end and inter-stage SAW filter elements 1, 2 and having the center frequency of 1.57 GHZ band.

In the measurement, the output external terminal 42 of the front-end SAW filter element 1 and the input external terminal 43 of the inter-stage SAW filter element 2 were connected to 50 Ω resistors, respectively. A ratio of the signal level of the output external terminal 44 of the inter-stage SAW filter element 2 to the signal level of the input external terminal 41 of the front-end SAW filter element 1 was measured in decibel(dB).

Figure 15:
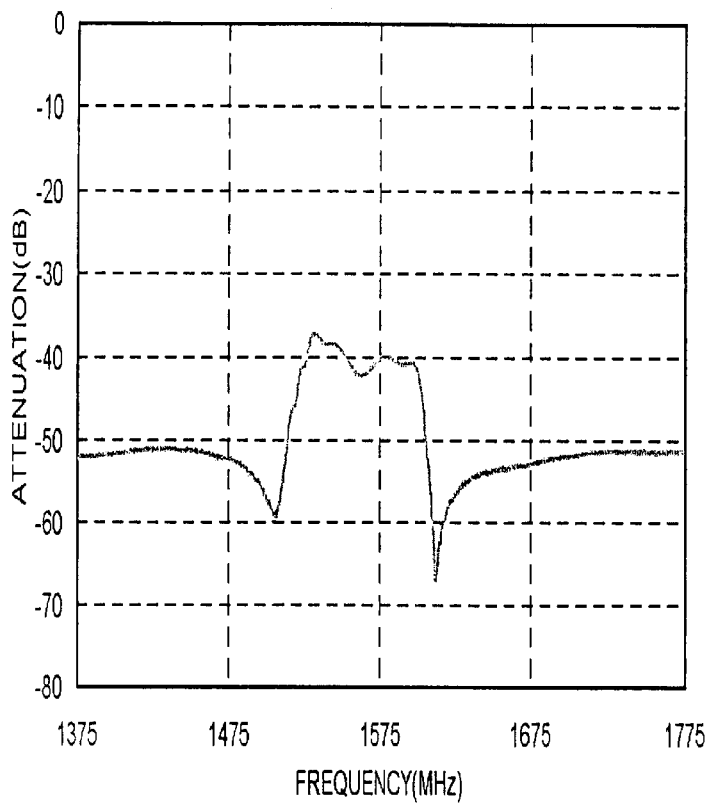
FIG. 15 is a graph illustrating the isolation characteristics of the weak signal extracting filter of the present invention.
Figure 16:
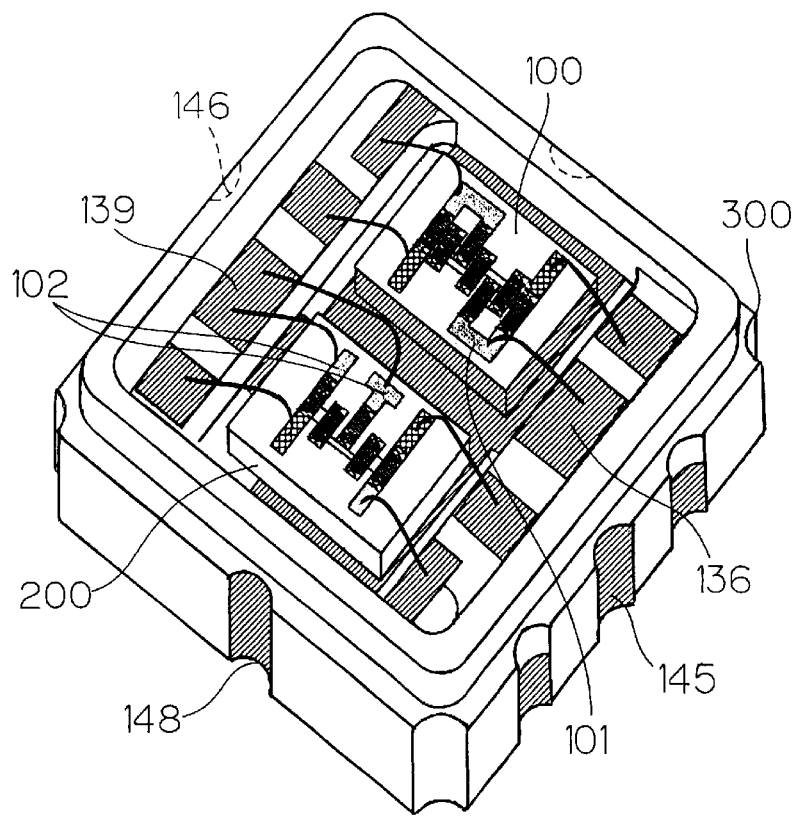
FIG. 16 is a perspective view of a weak signal extracting filter of prior art with its metallic lid omitted, particularly illustrating the relationship between the SAW elements and the pads.
Figure 18:
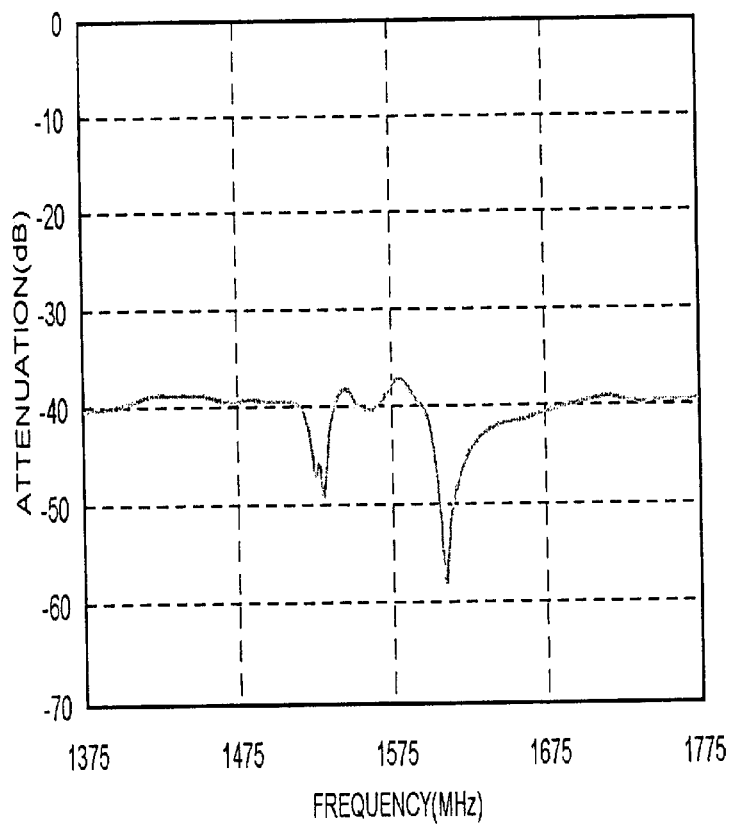
FIG. 18 is a graph illustrating the isolation characteristics of the weak signal extracting filter of prior art.

In a weak signal extracting filter device having the connection structure between the ground external terminals 45 to 48 and the metallic lid 7 according to the present invention, an attenuation amount of −52 dB was obtained at the lower frequency side (e.g., 1.48 GHz) from the pass band as shown in FIG. 15. On the other hand, in a device of prior art having the arrangement that all the ground external terminals are connected to the metallic lid and that a single ground conductor film is shared with two SAW filter elements in the cavity, an attenuation amount of about −40 dB was merely obtained at the lower frequency side (e.g., 1.48 GHz) from the pass band as shown in FIG. 18.

Further, in the weak signal extracting filter device having the connection structure between the ground external terminals 45 to 48 and the metallic lid 7 according to the present invention, an attenuation amount of −51 dB was obtained at the high frequency side (e.g., 1.68 GHz) of the pass band as shown in FIG. 15. On the other hand, in the device of prior art, an attenuation amount of about −40 dB was merely obtained as shown in FIG. 18.

It is considered that these results are obtained for the following reasons.

(1) The high impedance portions of the ground conductor films 51, 52 are connected to the ground external terminals 45, 46, and only the ground external terminals 45, 46 connected to the high impedance portions are connected to the metallic lid 7. Accordingly, the metallic lid 7 has potential near to the ideal ground. Thus, the metallic lid 7 has a sufficient shield effect, thus making it difficult to generate crosstalk between the two SAW filter elements 1, 2.

(2) Those portions of the ground conductor films 51, 52 which are respectively connected to the opposite ground external terminals 47, 48, are formed as low impedance portions. Further, these low impedance portions of the ground conductor films 51, 52 are not electrically connected to the metallic lid 7 outside of the container 3. Accordingly, the potentials of the ground conductor films 51, 52 are sufficiently dropped to the ground potential. This restrains parasitic impedance elements, thus making it difficult to generate crosstalk between the two SAW filter elements.

(3) The ground external terminals 45, 46 connected to the high impedance portions of the ground conductor films, are formed on the external lateral sides at positions between the two adjacent SAW filter elements. Further, the ground external terminal 46 connected to one SAW filter element 1 and the ground external terminal 45 connected to the other SAW filter element 2, are formed on the opposite external lateral sides. Only the opposite ground external terminals 45, 46 are electrically connected to the metallic lid 7 outside of the container 3. Accordingly, that portion on the metallic lid 7 which is located in a virtual line partitioning the two SAW filter elements 1, 2, has potential near to the ideal ground potential. Thus, a shield effect stronger than that obtained at (1) can be obtained on the metallic lid 7, thus making it difficult to generate crosstalk between the two SAW filter elements.

(4) In the cavity portion 30 of the container 3, the ground conductor films 51, 52 are respectively dedicated to the SAW filter elements 1, 2 and physically separated from each other. This makes it difficult to generate crosstalk between the two SAW filter elements.

(5) The ground conductor films 51, 52 themselves are separated from each other, thus reducing the conductor area of each ground conductor film. This results in reduction in parasitic element generated due to one ground conductor film 51 for example, thus reducing crosstalk.

(6) One ground conductor film 51 for example is connected to a plurality of ground external terminals (the two ground external terminals 46, 47 in the first embodiment), and these ground external terminals 46, 47 are connected in different directions. Accordingly, the ground potential of the ground conductor film 51 is relatively uniformed. This is also applied to the other ground conductor film 52.

The ground conductor films 51, 52 are respectively dedicated to the SAW filter elements and separated from each other. However, care should be used in connecting the ground electrodes 13 to 14, 23 to 25 of the two SAW filter elements 1,2 to the ground pads 35 to 40 with bonding wires. That is, when ground electrodes of the two SAW filter elements 1, 2 are connected to a single ground pad, e.g., when the ground electrode 13 of the SAW filter element 1 and the ground electrode 23 of the SAW filter element 2 are connected to the ground pad 35, this lowers the effect normally obtained by separating the ground conductor films 51, 52 from each other.

In this connection, when connecting the ground electrodes 13 to 14, 23 to 25 of the two SAW filter elements 1,2 to the ground pads 35 to 40 on the step portions 3a, 3b of the cavity portion 30, the following should be noted. That is, the ground pads 35, 38, 39 electrically connected to one ground conductor film 51 are used only for connection of the front-end SAW filter element 1, the ground pads 36, 37, 40 electrically connected to the other ground conductor film 52 are used only for connection of the inter-stage SAW filter element 2. It is important that ground electrodes of the SAW filter elements 1, 2 are not connected to common ground pads.

The inventors of this application actually measured the isolation characteristics of a comparative example in which the ground electrodes 13, 23 of the two SAW filter elements 1, 2 were connected to the single ground pad 35.

Figure 21:
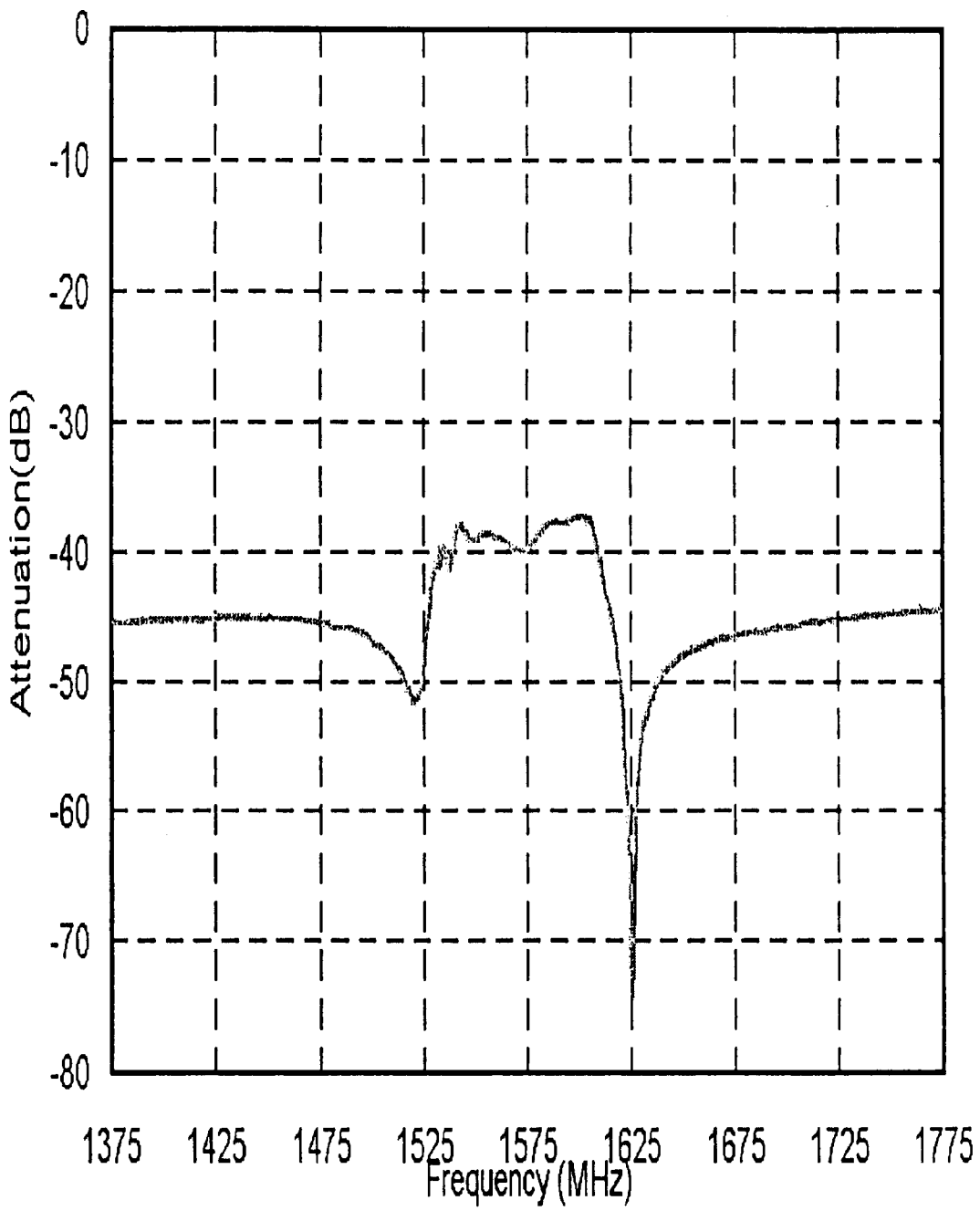
FIG. 21 is a graph illustrating the isolation characteristics of a weak signal extracting filter of Comparative Example in which a ground pad is shared with two SAW elements.

The result is shown in FIG. 21. As shown in FIG. 21, an attenuation amount of about −44 dB was merely obtained at the low frequency side (e.g., 1.48 GHz) from the pass band, and an attenuation amount of about −45 dB was merely obtained at the high frequency side (e.g., 1.68 GHz).

As understood from the result above-mentioned, it is important in view of isolation characteristics that the ground electrodes 13, 14 of the front-end SAW filter element 1 are connected to the ground pads 35, 38 electrically connected to the ground conductor film 51 on which the front-end SAW filter element 1 is mounted, and the ground electrodes 23 to 25 of the inter-stage SAW filter element 2 are connected to the ground pads 36, 40, 37 electrically connected to the ground conductor film 52 on which the inter-stage SAW filter element 2 is mounted.

Second Embodiment

The following description will discuss a weak signal extracting filter according to a second embodiment of the present invention.

Figure 8B:
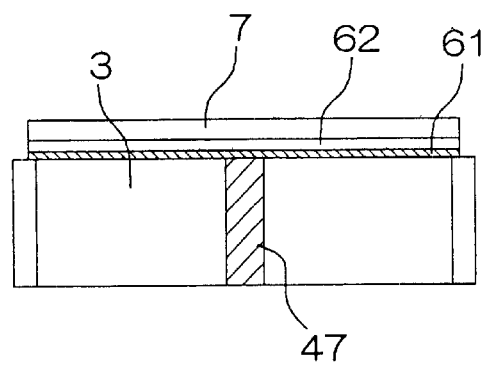
FIG. 8B is a side view of another weak signal extracting filter container at other lateral side thereof.
Figure 11B:
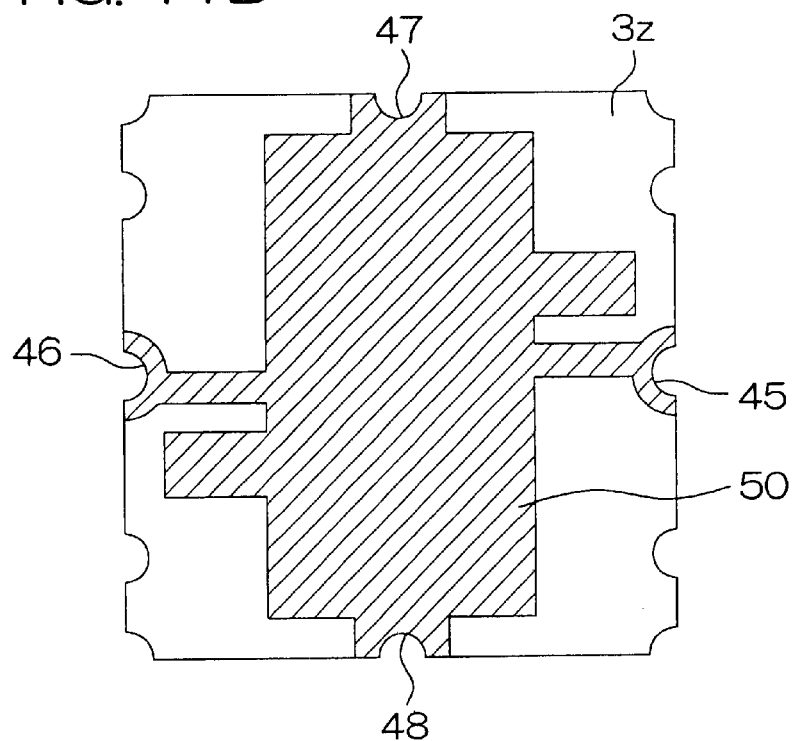
FIG. 11B is a plan view of another lowermost ceramic layer of the weak signal extracting filter container.

The weak signal extracting filter of the second embodiment is characterized by the arrangement of ground external terminals. To measure the effect obtained by the feature of the second embodiment, the weak signal extracting filter of the second embodiment has a single ground conductor film 50, instead of two ground conductor films respectively dedicated to SAW filter elements 1, 2, as shown in FIG. 11B. Further, connected to the metallic lid 7 are not only the ground external terminals 45,46 connected to the high impedance portion of the ground conductor film 50, but also the ground external terminals 47, 48 connected to the low impedance portion, as shown in FIG. 8B.

The following description will discuss the characteristic arrangement of the weak signal extracting filter of the second embodiment.

In the weak signal extracting filter of the second embodiment, a plurality of input/output external terminals 41 to 48 are formed at the external lateral side of a container 3 as shown in FIG. 3. Out of these input/output external terminals 41 to 48, the input external terminal 41 electrically connected to the front-end SAW filter element 1 is formed in the vicinity of a first corner portion J.

As shown in FIG. 3, the input external terminal 41 is formed at a lateral side having the first corner portion J as a corner. However, the input external terminal 41 may also be formed at the lateral side at a right angle to the first-mentioned lateral side, or may also be formed at the first corner portion J.

The output external terminal 44 electrically connected to the inter-stage SAW filter element 2 is formed in the vicinity of a second corner portion K located in the diagonal direction with respect to the first corner portion J of the container 3.

As shown in FIG. 3, the output external terminal 44 is formed at a lateral side having the second corner portion K as a corner. However, the output external terminal 44 may also be formed at the lateral side at a right angle to the first-mentioned lateral side, or may also be formed at the second corner portion K.

Thus, the input external terminal 41 of the front-end SAW filter element 1 and the output external terminal 44 of the inter-stage SAW filter element 2, are disposed substantially in a diagonal direction of the container 3. More specifically, the input external terminal 41 connected to the front-end SAW filter element 1 and the input external terminal 43 connected to the inter-stage SAW filter element 2, are formed at one side of a pair of opposite lateral sides of the container 3. Further, the output external terminal 42 connected to the front-end SAW filter element 1 and the output external terminal 44 connected to the inter-stage SAW filter element 2, are formed at the other side of the pair of opposite lateral sides of the container 3.

In this weak signal extracting filter as shown in FIG. 11B, the single ground conductor film 50 is formed on the mounting surface 3c of the cavity portion 30 surrounded by the step portions 3a, 3b (see FIG. 3). More specifically, the ground conductor film 50 is formed on the top of the ceramic layer 3z (see FIGS. 7, 9) and in the area where two SAW filter elements 1, 2 are mounted.

The ground conductor film 50 extends to the lower part of the concave portion of the second ground pad 35 on the right-hand step portion 3a in FIG. 3, such that the ground conductor film 50 is connected to the ground pad 35. Also, the ground conductor film 50 extends to the lower part of the concave portion of the fourth ground pad 40 on the left-hand step portion 3b in FIG. 3, such that the ground conductor film 50 is connected to the ground pad 40. Further, the ground conductor film 50 extends to concave portions formed in the upper and lower sides in FIG. 11B and are electrically connected to conductor films serving as the ground external terminals 47, 48. Further, the ground conductor film 50 extends to concave portions formed in the centers of the lateral sides in FIG. 11B and are electrically connected to the ground external terminals 45, 46. More specifically, the ground conductor film 50 is grounded to the ground potential in a plurality of different directions.

FIG. 8B is a side view of the external lateral side of the container 3 where the ground external terminal 47 is formed. At this external lateral side, only the ground external terminal 47 is formed. The ground external terminal 48 is formed at the external lateral side opposite to the first-mentioned external lateral side.

The ground external terminals 47, 48 are formed as extending from the bottom to the top of the container 3. More specifically, the ground external terminals 47, 48 are connected to the seal-ring connecting conductor film 61, and also connected to the metallic lid 7 therethrough.

The arrangement of input/output external terminals above-mentioned maximizes the distance between the output external terminal 44 connected to the inter-stage SAW filter element 2 and the input external terminal 41 connected to the front-end SAW filter element 1. Accordingly, a signal supplied to the input external terminal 41 of the front-end SAW filter element 1 connected to the antenna circuit less enters directly to the output external terminal 44 of the inter-stage SAW filter element 2, thus making it difficult to generate crosstalk.

The arrangement above-mentioned can restrain crosstalk from being generated between the SAW filter elements 1, 2 for the following reasons.

It is considered that the crosstalk between the input external terminal 41 of the front-end SAW filter element 1 and the output external terminal 44 of the inter-stage SAW filter element 2, includes:

(a) crosstalk generated because electromagnetic waves coming out from the input external terminal 41 of the front-end SAW filter element 1 are transmitted in the air directly to the output external terminal 44;

(b) crosstalk generated because electromagnetic waves coming out from the input external terminal 41 of the front-end SAW filter element 1 are transmitted in the air directly to the output external terminal 42 of the front-end SAW filter element 1 and;

(c) crosstalk generated because electromagnetic waves coming out from the input external terminal 41 of the front-end SAW filter element 1 are transmitted in the air directly to the input external terminal 43 of the inter-stage SAW filter element 2.

It is considered that the crosstalk resulting from the interference of the input external terminal 41 with the input external terminal 43 stated at (c) above-mentioned, is large because the distance between the terminals 41, 43 are the shortest. However, a major part of the interference component is cut after having passed through the inter-stage SAW filter element 2, thus exerting no substantial influence on the filter characteristics. As to the item (b) above-mentioned, the interference component exerts no substantial influence for the same reason.

As to the item (a) above-mentioned, however, the interference component transmitted to the output external terminal 44 directly exerts influence on the isolation characteristics of the weak signal extracting filter.

In the second embodiment of the present invention, however, the input external terminal 41 and the output external terminal 44 are respectively formed in the vicinity of the first corner portion J of the container 3 and in the vicinity of the second corner portion K in the diagonal direction with respect to the first corner portion J. This maximizes the distance between the input external terminal 41 and the output external terminal 44, thus minimizing the direct interference between the input external terminal 41 and the output external terminal 44. This assures excellent isolation characteristics.

The following description will discuss the crosstalk between the input pad 31 connected to the input external terminal 41 inside of the container 3 and the output pad 34 connected to the output external terminal 44, and the crosstalk between the bonding wire for the input pad 31 and the bonding wire for the output pad 34.

Preferably, these pads are disposed so as not to be parallel with each other, and these bonding wires are disposed so as not to be parallel with each other.

According to the second embodiment, however, the distance between the input external terminal 41 and the output external terminal 44 is maximized. Accordingly, even though the pads and the bonding wires are respectively disposed in parallel with each other, the crosstalk between the pads and the crosstalk between the bonding wires can be minimized. This means that the pads can be disposed in parallel with each other and that the bonding wires can be disposed in parallel with each other. Accordingly, the pads and the bonding wires can be formed in one direction, thus achieving miniaturization of the weak signal extracting filter.

Figure 19:
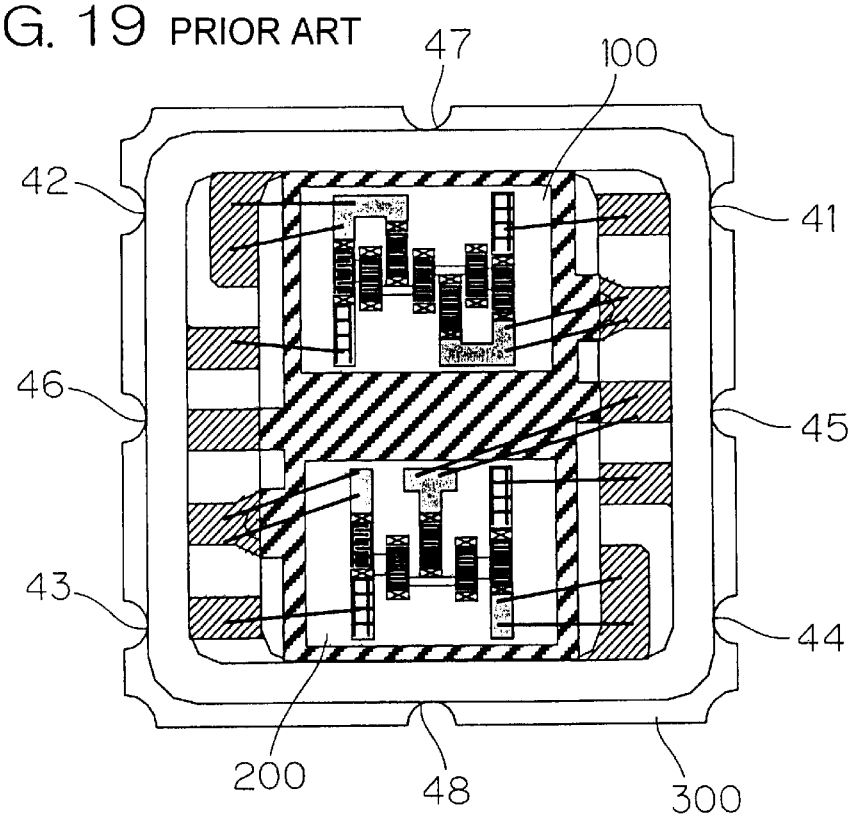
FIG. 19 is a plan view of a weak signal extracting filter of prior art with no provision made for the arrangement of input/output external terminals, illustrating the filter with its metallic lid omitted.

The following description will discuss the crosstalk between the input external terminal 41 and the output external terminal 44 when the input external terminal 41 and the output external terminal 44 are not disposed as shown in FIG. 3, but are disposed as shown in FIG. 19.

FIG. 19 is a plan view of the arrangement in which the input external terminal 41 of the front-end SAW filter element 1 is formed as it is as shown in FIG. 3, and the output external terminal 44 of the inter-stage SAW filter element 2 is disposed at the same side at which the input external terminal 41 is disposed.

In FIG. 19, the distance between the input external terminal 41 of the front-end SAW filter element 1 and the output external terminal 44 of the inter-stage SAW filter element 2 is relatively short. Accordingly, an electric wave is readily transmitted from the input external terminal 41 directly to the output external terminal 44, thus increasing the interference component. Therefore, sufficient isolation characteristics cannot be obtained as compared with each embodiment of the present invention. This can also be applied to the interference between the pads, and the interference between the bonding wires.

The inventors of this application simulated the isolation characteristics of a weak signal extracting filter in which each of the front-end SAW filter element 1 and the inter-stage SAW filter element 2 has center frequency of 1.57 GHZ.

Figure 22:
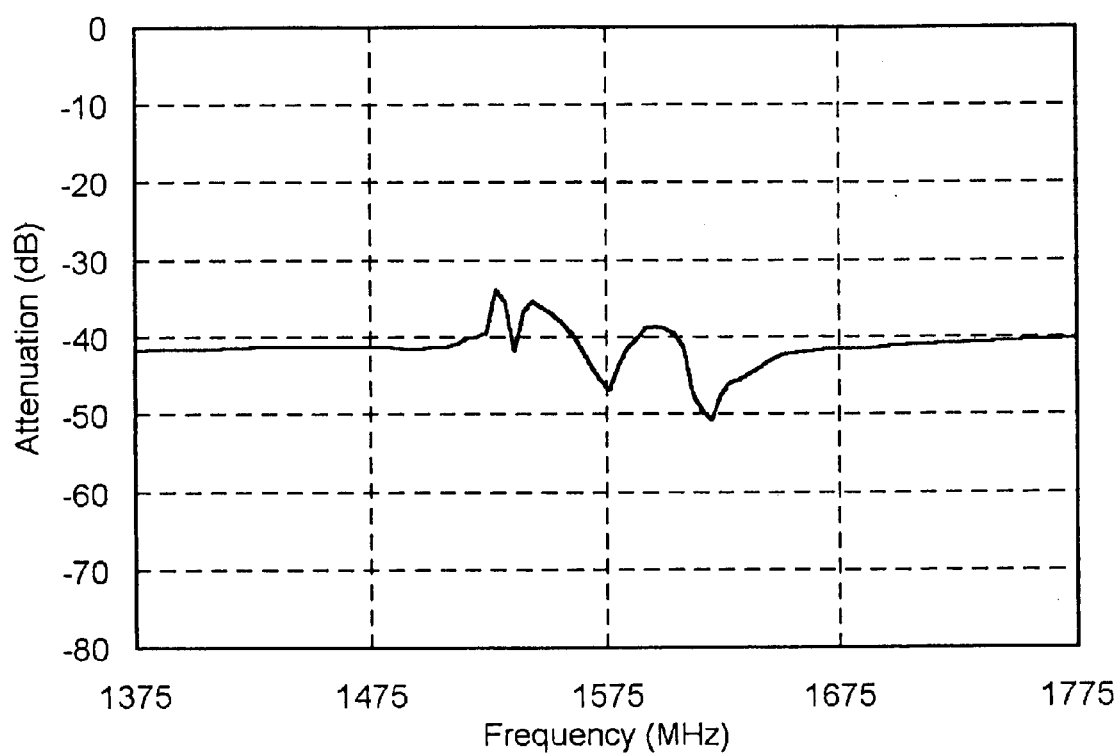
FIG. 22 is a graph illustrating the isolation characteristics of a weak signal extracting filter having the arrangement of external input/output terminals of the present invention.
Figure 23:
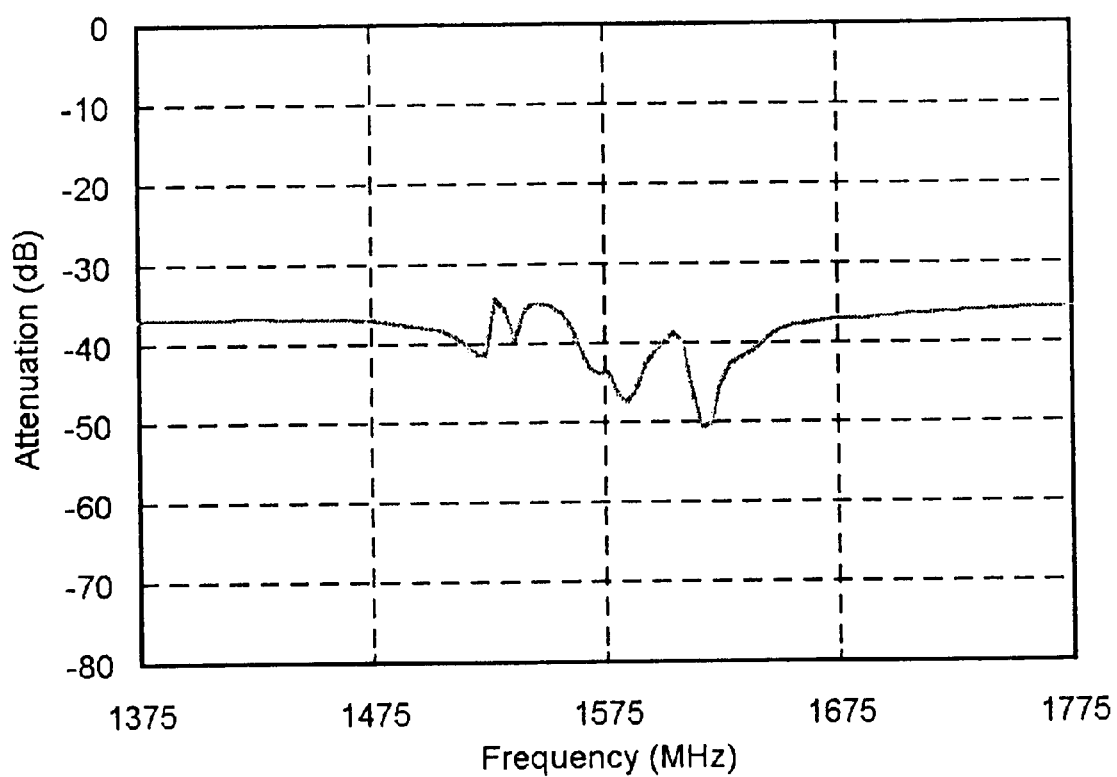
FIG. 23 is a graph illustrating the isolation characteristics of a weak signal extracting filter having the arrangement of external input/output terminals of prior art.

The simulation results are shown in FIGS. 22, 23. For the arrangement of the input/output external terminals 41,44 of the present invention as shown in FIG. 3, an attenuation amount of −41 dB was obtained at the lower frequency side (e.g., 1.48 GHz) from the pass band as shown in FIG. 22. On the other hand, for the arrangement of the input/output external terminals 41,44 as shown in FIG. 19, an attenuation amount of about −37 dB was merely obtained at the lower frequency side (e.g., 1.48 GHz) from the pass band as shown in FIG. 23.

Further, in the arrangement of the input/output external terminals 41,44 according to the present invention as shown in FIG. 3, an attenuation amount of −42 dB was obtained at the high frequency side (e.g., 1.68 GHz) of the pass band as shown in FIG. 22. On the other hand, in the arrangement of the input/output external terminals 41,44 as shown in FIG. 19, an attenuation amount of about −37 dB was merely obtained at the high frequency side (e.g., 1.68 GHz) of the pass band as shown in FIG. 23.

It is considered that such results are obtained for the following reasons.

(a) In the external terminal arrangement according to the present invention, there are maximized the distance between the input external terminal 41 and the output external terminal 44 in the container 3, and the distance between the input pad 31 and the output pad 34. This makes it difficult to generate direct crosstalk between the input external terminal 41 of the front-end SAW filter element 1 and the output external terminal 44 of the inter-stage SAW filter element 2. This is also applied to the pads 31, 34 in the container 3.

(b) In the external terminal arrangement according to the present invention, the interference component from the input external terminal 41 to the input external terminal 43 in the container 3, is considered to be the largest indirect interference component. However, the influence of indirect crosstalk is small because this interference component is attenuated by the inter-stage SAW filter element 2. This is also applied to the pads and the bonding wires in the container 3.

(c) The direct interference between the bonding wires is restrained because the distance between the bonding wires is long. Further, the bonding wire connected to the input external terminal of the front-end SAW filter element 1 and the bonding wire connected to the output external terminal of the inter-stage SAW filter element 2, are disposed in a diagonal direction in which these bonding wires are not adjacent to each other. This restrains the crosstalk between these bonding wires.

As understood from the foregoing, the arrangement that the input external terminal 41 of the front-end SAW filter element 1 and the output external terminal 44 of the inter-stage SAW filter element 2, are disposed at opposite sides, results in excellent isolation characteristics.

Other Embodiments

In each of the embodiments above-mentioned, the description has been made of the weak signal extracting filter having the two SAW filter elements 1, 2 housed in the cavity portion 30. According to the present invention, however, three or more SAW filter elements may be housed in the cavity portion 30.

Further, the two SAW filter elements 1,2 may be formed on a single board.

For example, when three SAW filter elements are housed, opposite ground external terminals disposed at positions where the three elements are partitioned from one another, may be connected to the metallic lid, and three ground conductor films may be disposed respectively for the three SAW filter elements. In the connection of ground external terminals to the ground conductor films, provision may be made such that no ground conductor film is commonly used. Further, the input external terminal of the forefront SAW filter element and the output external terminal of the last-stage SAW filter element, may be disposed at opposite sides.

In each of the embodiments above-mentioned, the description has been made of a weak signal extracting filter, but the present invention may widely be applied to any surface acoustic wave device having two or more SAW filter elements housed in a single container.

What we claim is:

1. A surface acoustic wave device comprising:
   (i) a container, (ii) input external terminals, output external terminals and ground external terminals which are disposed at the outer peripheral surfaces of said container, and (iii) input pads, output pads and ground pads which are disposed inside of a cavity portion of said container and which are respectively electrically connected to said input external terminals, said output external terminals and said ground external terminals;
   a plurality of SAW filter elements housed in said cavity portion of said container;
   a plurality of ground conductor films respectively formed in the areas where said SAW filter elements are housed in said cavity portion, a total number of ground conductor films equaling a total number of SAW filter elements housed in said cavity portion; and
   a metallic lid which hermetically seals said cavity portion of said container;

wherein the input electrodes, output electrodes and ground electrodes of said SAW filter elements are respectively connected to said input pads, said output pads and said ground pads, said ground conductor films respectively formed in the areas where said SAW filter elements are respectively housed, being electrically separated from one another within said container.

2. A surface acoustic wave device comprising:
(i) a container, (ii) input external terminals, output external terminals and ground external terminals which are disposed at the outer peripheral surfaces of said container, and (iii) input pads, output pads and ground pads which are disposed inside of a cavity portion of said container and which are respectively electrically connected to said input external terminals, said output external terminals and said ground external terminals;
a plurality of SAW filter elements housed in said cavity portion of said container;
a plurality of ground conductor films respectively formed in the areas where said SAW filter elements are housed in said cavity portion; and
a metallic lid which hermetically seals said cavity portion of said container,
wherein the input electrodes, output electrodes and ground electrodes of said SAW filter elements are respectively connected to said input pads, said output pads and said ground pads,
said ground conductor films respectively formed in the areas where said SAW filter elements are respectively housed, being electrically separated from one another within said container,
wherein at least one of the ground external terminals connected to each ground conductor film, is connected to said metallic lid, and other ground external terminal than said at least one ground external terminal is not connected to said metallic lid, and a high impedance portion is formed at that area of each ground conductor film which is located in the vicinity of said at least one ground external terminal connected to said metallic lid.

3. A surface acoustic wave device according to claim 2, wherein a low impedance portion is formed at that area of each ground conductor film which is located in the vicinity of said ground external terminal which is not connected to said metallic lid.

4. A surface acoustic wave device according to claim 2, wherein said ground external terminals connected to said metallic lid are located in opposite positions of outer peripheral surfaces of said container, said opposite positions partitioning the neighboring two SAW filter elements.

5. A surface acoustic wave device according to claim 2, wherein said ground pads to which said ground electrodes of said SAW filter elements are respectively connected, are electrically separated from one another inside of said container.

6. A surface acoustic wave device according to claim 2, wherein said ground external terminals are formed on different outer peripheral surfaces of said container.

7. A surface acoustic wave device according to claim 2, wherein only one SAW filter element is connected to the same ground pad.

8. A surface acoustic wave device comprising:
(i) a rectangular container, (ii) input external terminals, output external terminals and ground external terminals which are disposed on outer peripheral surfaces of said container, and (iii) input pads, output pads and ground pads which are disposed inside of a cavity portion of said container and which are respectively electrically connected to said input external terminals, said output external terminals and said round external terminals;
a plurality of SAW filter elements housed in said cavity portion of said container to be connected in cascade to one another;
a plurality of ground conductor films respectively formed in the areas where said SAW filter elements are housed in said cavity portion, a total number of ground conductor films equaling a total number of SAW filter elements housed in said cavity portion; and
a metallic lid which hermetically seals said cavity portion of said container,
the input electrodes, output electrodes and ground electrodes of said SAW filter elements being respectively connected to said input pads, said output pads and said ground pads,
the input external terminal electrically connected to the forefront SAW filter element out of said SAW filter elements, being formed at or in the vicinity of a first corner portion of said outer peripheral surfaces of said container, and the output external terminal electrically connected to the last-stage SAW filter element, being formed at or in the vicinity of a second corner portion which is located in a diagonal direction with respect to said first corner portion.

9. A surface acoustic wave device according to claim 8, wherein said ground conductor films respectively formed in the areas where said SAW filter elements are housed, are electrically separated from one another within said container.

10. A surface acoustic wave device comprising:
(i) a rectangular container, (ii) input external terminals, output external terminals and ground external terminals which are disposed on outer peripheral surfaces of said container, and (iii) input pads, output pads and ground pads which are disposed inside of a cavity potion of said container and which are respectively electrically connected to said input external terminals, said output external terminals and said ground external terminals;
a plurality of SAW filter elements housed in said cavity portion of said container to be connected in cascade to one another;
a ground conductor film formed in the area where said SAW filter elements are housed in said cavity portion; and
a metallic lid which hermetically seals said cavity portion of said container,
the input electrodes, output electrodes and ground electrodes of said SAW filter elements being respectively connected to said input pads, said output pads and said ground pads,
the input external terminal electrically connected to the forefront SAW filter out of said SAW filter elements, being formed at or in the vicinity of a first corner portion of said outer peripheral surfaces of said container, and the output external terminal electrically connected to the last-stage SAW filter element, being formed at or in the vicinity of a second corner portion which is located in a diagonal direction with respect to said first corner portion, and
wherein said ground conductor film is formed in the area where each SAW filter element is housed in said cavity portion; and said ground conductor films respectively formed in the areas where said SAW filter elements are housed, are electrically separated from one another within said container, wherein at least one of said ground external terminals connected to each ground conductor film, is connected to said metallic lid, and other ground external terminal than said at least one ground external terminal is not connected to said metallic lid, and a high impedance portion is formed at that area of each ground conductor film which is located in the vicinity of said at least one ground external terminal connected to said metallic lid.

* * * * *